United States Patent [19]

Kobayashi et al.

[11] Patent Number: 5,663,697

[45] Date of Patent: Sep. 2, 1997

[54] SURFACE ACCOUSTIC WAVE FILTER

[75] Inventors: Yasumi Kobayashi; Kuniyuki Matsui; Yasuhiro Hirao; Kousuke Takeuchi; Hiroshi Kayaki; Yusuke Takahashi; Toshiharu Tanaka; Isao Kiyose, all of Osaka-fu; Kenichi Shibata, Wakayama-ken, all of Japan

[73] Assignee: Sanyo Electric Co., Ltd., Moriguchi, Japan

[21] Appl. No.: 635,678

[22] Filed: Apr. 22, 1996

Related U.S. Application Data

[62] Division of Ser. No. 301,100, Sep. 6, 1994, Pat. No. 5,543,757.

[30] Foreign Application Priority Data

| Sep. 6, 1993 | [JP] | Japan | 5-220955 |
| Sep. 9, 1993 | [JP] | Japan | 5-224655 |
| Oct. 6, 1993 | [JP] | Japan | 5-250332 |

[51] Int. Cl.$^6$ .................................................. H03H 9/64
[52] U.S. Cl. .................. 333/195; 333/193; 310/313 B; 310/313 D
[58] Field of Search .................. 333/193–196; 310/313 R–313 D

[56] References Cited

U.S. PATENT DOCUMENTS

| 4,130,813 | 12/1978 | Sandy et al. | 333/195 |
| 4,166,258 | 8/1979 | Tseng | 333/195 |
| 4,342,011 | 7/1982 | Iwamoto et al. | 333/195 |
| 4,551,695 | 11/1985 | Tanji et al. | 333/195 |
| 4,742,319 | 5/1988 | Sone | 333/195 |
| 4,803,449 | 2/1989 | Hikita et al. | 333/195 |
| 5,274,345 | 12/1993 | Gau | 333/195 |
| 5,365,206 | 11/1994 | Machui et al. | |
| 5,499,003 | 3/1996 | Davenport | 333/195 |
| 5,506,552 | 4/1996 | Seki et al. | 333/195 |
| 5,521,453 | 5/1996 | Yatsuda | 333/193 |
| 5,543,757 | 8/1996 | Kobayashi et al. | 333/195 |

FOREIGN PATENT DOCUMENTS

| 0 541 284 A1 | 5/1993 | European Pat. Off. | |
| 40 18 784 A1 | 12/1991 | Germany | |
| 95-007740 | 12/1994 | Germany | 333/195 |
| 56-19765 | 5/1981 | Japan | |
| 4-81823 | 3/1992 | Japan | |

OTHER PUBLICATIONS

German Office Action w/Translation.
"Some Studies on SAW Resonators and Multiple–Mode Filters", Y. Suzuki et al., Faculty of Engineering, Tohoku University, Sendai, Japan, 1976 Ultrasonics Symposium Proceedings, IEEE Cat. #76 CH1120–5SU, pp. 297–302.

*Primary Examiner*—Benny Lee
*Assistant Examiner*—Darius Gambino
*Attorney, Agent, or Firm*—Armstrong, Westerman, Hattori, McLeland & Naughton

[57] ABSTRACT

A surface acoustic wave filter according to the present invention is constructed by connecting in series one or two or more filter functional units each comprising a first surface acoustic wave resonator having input and output terminals connected in series with a signal line and a second surface acoustic wave resonator having input and output terminals one of which is connected to the signal line and the other of which is grounded. The first surface acoustic wave resonator is constituted by one interdigital transducer and a pair of electrically open strip type grating reflectors with the interdigital transducer interposed therebetween, and the second surface acoustic wave resonator is constituted by one interdigital transducer and a pair of electrically short strip type grating reflectors with the interdigital transducer interposed therebetween.

2 Claims, 26 Drawing Sheets

CH1 S21 LOG MAG 5dB/REF -2.9dB
CH2 S21 LOG MAG 1dB/REF -2.9dB

CENTER 836.000 000 MHz    SPAN 150.000 000

CH1 S21 LOG MAG 5dB/REF -2.9dB
CH2 S21 LOG MAG 1dB/REF -2.9dB

CENTER 836.000 000 MHz    SPAN 150.000 000

Mi: THE MINIMUM NUMBER OF ELECTRODE FINGERS IN THE COMB-SHAPED INPUT ELECTRODE

Mr: THE NUMBER OF REFLECTOR ELEMENTS IN THE COMB-SHAPED REFLECTOR 5,663,697

1

SURFACE ACCOUSTIC WAVE FILTER

This is a divisional of application Ser. No. 08/301,100 filed Sep. 6, 1994, patented, U.S. Pat. No. 5,543,757.

BACKGROUND OF THE INVENTION

1. Field of the Invention

The present invention relates to a surface acoustic wave filter utilizing surface acoustic waves.

2. Description of the Prior Art

With the recent rapid spread of automobile telephones and portable telephones, the necessity for surface acoustic wave high-frequency filters, is increased as a small-sized and high-performance high-frequency filter. A transversal type filter which is one type of the surface acoustic wave high-frequency filters has been already put to practical use.

As a further subject of improving characteristics, however, it is desired to reduce the loss so that no matching circuit is required. Therefore, a resonator type filter is paid attention to (see Japanese Patent Publication No. 19765/1981). In addition, an interdigitated interdigital transducer type surface acoustic wave filter is similarly paid attention to.

Various methods of constructing resonator type filters have been considered. Description is made of a ladder type surface acoustic wave high-frequency filter which is one of the resonator type filters.

The surface acoustic wave high-frequency filter is constructed by connecting in series one or more filter functional units each comprising a surface acoustic wave resonator. FIG. 21 is a circuit diagram showing a filter functional unit. The filter functional unit comprises a first surface acoustic wave resonator 343 having input and output terminals connected in series with a signal line and a second surface acoustic wave resonator 344 having input and output terminals one of which is connected to the signal line and the other of which is grounded. Each of the resonators 343 and 344 has double resonance characteristics. In addition, reference numerals 345 and 346 in FIG. 21 denote input and output terminals in the signal line, and 347 denotes the ground.

FIG. 22 is a graph showing the idealized impedance characteristics of the surface acoustic wave resonator. For simplicity of illustration, impedance shall be pure reactance. The impedance of the resonator 343 connected in series with the signal line is indicated by $X_1$ and the impedance of the resonator 344 connected in parallel with the signal line is indicated by $X_2$.

Since each of the resonators has double resonance characteristics, it has two resonance frequencies whose impedance is zero and infinity. The frequency whose impedance is zero is referred to as a resonance frequency or a resonance point, and the frequency whose impedance is infinity is referred to as an antiresonance frequency or an antiresonance point.

If the resonance point of the resonator 343 and the antiresonance point of the resonator 344 coincide with each other, signals are passed in the vicinity of the frequency because the resonator 343 enters an ON state and the resonator 344 enter an OFF state. On the other hand, the resonator 343 enters an OFF state at the antiresonance point, whereby an attenuation pole is produced on the side of frequencies higher than those in the passband. In addition, the resonator 344 enters an ON state at the resonance point, whereby an attenuation pole is produced even on the side of frequencies lower than those in the passband.

Several filter functional units are connected in series, thereby to obtain characteristics required for a band-pass filter. FIG. 29 is a schematic plan view showing a surface acoustic wave high-frequency filter in which three filter functional units are connected in series, and FIG. 30 is a diagram showing its equivalent circuit. Each of surface acoustic wave resonators 407 to 409 is connected in parallel with a signal line, and each of surface acoustic wave resonators 410 to 412 is connected in series with a signal line. A first filter functional unit is constituted by the surface acoustic wave resonators 407 and 410, a second filter functional unit is constituted by the surface acoustic wave resonators 408 and 411, and a third filter functional unit is constituted by the surface acoustic wave resonators 409 and 412. The surface acoustic wave resonators 407 to 412 are two-terminal resonators having double resonance characteristics. In addition, the surface acoustic wave high-frequency filter has input and output terminals 450 and 451.

The problem is that the actual surface acoustic wave resonator does not exhibit ideal impedance characteristics as shown in FIG. 22.

The problem will be considered in terms of the characteristics of reflectors. For example, a resonator comprising an interdigital transducer 348 and electrically open strip type grating reflectors 349 and 350 as shown in FIG. 23 has impedance characteristics as shown in FIG. 24.

Furthermore, a resonator comprising an interdigital transducer 351 and electrically short strip type grating reflectors 352 and 353 as shown in FIG. 25 has impedance characteristics as shown in FIG. 26. In FIGS. 24 and 26, a solid line indicates a real resistance component, and a dotted line indicates a reactance component.

The characteristics of the resonator shown in FIG. 23 are distorted in the vicinity of the antiresonance point. The characteristics of a surface acoustic wave high-frequency filter in which filter functional units in three stages each comprising the resonator are connected are as shown in FIG. 27. As can be seen from FIG. 27, both the in-band insertion loss and the out-of-band attenuation cannot be satisfied.

On the other hand, the characteristics of the resonator shown in FIG. 25 are distorted in the vicinity of the resonance point. The characteristics of a surface acoustic wave high-frequency filter in which filter functional units in three stages each comprising the resonator are connected are as shown in FIG. 28, which cannot be also satisfied, although they are improved over the characteristics shown in FIG. 27.

Furthermore, in the surface acoustic wave filter, it is not generally easy to ensure high attenuation outside the band irrespective of the characteristics of the reflectors, as apparent from frequency characteristics shown FIG. 31. Specifically, there is a problem of antimony that an attempt to obtain high attenuation outside the band increases the insertion loss.

As an effective solution for the problem, the impedance characteristics of the resonator connected in series with the signal line are made steeper while holding the frequency difference between the resonance point and the antiresonance point, as compared with the impedance characteristics of the resonator connected in parallel with the signal line.

Examples of a method of making the impedance characteristics steep include a method of decreasing the number of electrode fingers in the interdigital transducer. In this method, however, the impedance is changed asymmetrically on the side of low frequencies and high-frequencies, and the frequency difference between the resonance point and the antiresonance point is changed. Accordingly, this method is not suitable for the above described object.

Furthermore, there is a method of decreasing the cross width of electrode fingers (see Japanese Patent Laid-Open Gazette No. 81823/1992). If the cross width of electrode fingers is decreased to approximately a fraction of the original one, factors which are difficult to calculate such as the stray capacitance on end surfaces of the electrode fingers or an interaction between surface acoustic waves and a connecting electrode between the electrode fingers cannot be ignored. Accordingly, the frequency difference between the resonance point and the antiresonance point is changed, thereby to make it difficult to obtain high attenuation outside the band.

Description is now made of an interdigitated interdigital transducer type surface acoustic wave filter. FIGS. 35 and 36 illustrate conventional interdigitated interdigital transducer type surface acoustic wave filters. Two or more comb-shaped input electrodes 501a are formed in an input portion 501, and one or more comb-shaped output electrodes 502a are formed in an output portion 502. The comb-shaped input and output electrodes 501a and 502a are alternately disposed on the same propagation path.

A pair of strip type reflectors 503 and 503' or reflectors 504 and 504' is provided on the outermost side of a group of the comb-shaped input and output electrodes for the purpose of reducing the insertion loss. The reflectors 503 and 503' are referred to as ones in a comb shape (of an open strip type), in which reflector elements 503b . . . (503b'. . . ) extending from conductor portions 503a and 503a (503a' and 503a') oppositely arranged which constitute the reflector 503 (503') are so formed as not to be brought into contact with the opposite conductor portion 503a (503a'). On the other hand, the reflectors 504 and 504' are referred to as grating ones (of a short strip type), in which reflector elements 504b . . . (504b'. . . ) extending from conductor portions 504a and 504a (504a' and 504a') oppositely arranged which constitute the reflector 504 (504') are so formed as to be brought into contact with the opposite conductor portions 504a (504a').

The conventional interdigitated interdigital transducer type surface acoustic wave filters are respectively so constructed that the respective one conductor portions 503a and 503a' opposite to each other in both the reflectors 503 and 503' are connected to the ground, and the respective one conductor portions 504a and 504a' opposite to each other in both the reflectors 504 and 504' are connected to the ground.

The surface acoustic wave filter comprising the grating reflectors 504 and 504' out of the interdigitated interdigital transducer type surface acoustic filters of both the constructions has the disadvantage in that a ripple exists in the frequency characteristics. On the other hand, it is known that the conventional surface acoustic wave filter comprising the comb-shaped reflectors 503 and 503' allows a ripple produced by the effect of the reflectors to be reduced to some extent. Even in the interdigitated interdigital transducer type surface acoustic wave filter using the comb-shaped reflectors 503 and 503', however, a ripple of approximately 1 dB is produced within the passband, which does not satisfy the stability as a high-frequency element.

SUMMARY OF THE INVENTION

The present invention has been made in view of the foregoing circumstances and has for its object to provide a surface acoustic wave filter having superior characteristics.

Therefore, a surface acoustic wave filter according to the present invention is constructed by connecting in series one or two or more filter functional units each comprising a first surface acoustic wave resonator having input and output terminals connected in series with a signal line and a second surface acoustic wave resonator having input and output terminals one of which is connected to the signal line and the other of which is grounded, and wherein the first surface acoustic wave resonator is constituted by one interdigital transducer and a pair of electrically open strip type grating reflectors with the interdigital transducer interposed therebetween, and the second surface acoustic wave resonator is constituted by one interdigital transducer and a pair of electrically short strip type grating reflectors with the interdigital transducer interposed therebetween.

Consequently, such characteristics that there is no distortion of impedance at a resonance point of the resonator having the electrically open strip type grating reflectors and such characteristics that there is no distortion of impedance at an antiresonance point of the resonator having the electrically short strip type grating reflectors are made use of in the passband of the filter, thereby improving the characteristics of the filter.

Furthermore, a surface acoustic wave filter according to the present invention is constructed by connecting in series one or two or more filter functional units each comprising a first surface acoustic wave resonator having input and output terminals connected in series with a signal line and a second surface acoustic wave resonator having input and output terminals one of which is connected to the signal line and the other of which is grounded, and wherein the first surface acoustic wave resonator is constituted by one interdigital transducer and a pair of electrically short strip type grating reflectors with the interdigital transducer interposed therebetween, and the second surface acoustic wave resonator is constituted by one interdigital transducer and a pair of electrically open strip type grating reflectors with the interdigital transducer interposed therebetween.

Consequently, such characteristics that there is no distortion of impedance at a resonance point of the resonator having the electrically open strip type grating reflectors and such characteristics that there is no distortion of impedance at an antiresonance point of the resonator having the electrically short strip type grating reflectors are made use of in an attenuation pole of the filter, thereby improving the characteristics of the filter.

Additionally, a surface acoustic wave filter according to the present invention is constructed by connecting in series one or two or more filter functional units each comprising a first surface acoustic wave resonator having input and output terminals connected in series with a signal line and a second surface acoustic wave resonator having input and output terminals one of which is connected to the signal line and the other of which is grounded, and wherein the first surface acoustic wave resonator comprises two or more interdigital transducers connected in series.

In this construction, the impedance of the surface acoustic wave resonator comprising two interdigital transducers connected in series is two times, as indicated by a dotted line in FIG. 14, that of a resonator comprising only one interdigital transducer (indicated by a solid line). Specifically, letting the impedance of the resonator comprising only one interdigital transducer be $Z1(f)$, the impedance $Z2(f)$ of the resonator comprising two interdigital transducers connected in series is expressed by the following equation:

$$Z2(f)=2 \cdot Z1(f)$$

The impedance characteristics of the first surface acoustic wave resonator becomes steeper while holding the frequency difference between a resonance point and an antiresonance point, as compared with the impedance characteristics of the second surface acoustic wave resonator. Accordingly, the insertion loss can be reduced and at the same time, higher attenuation can be obtained outside the band.

Furthermore, a surface acoustic wave filter according to the present invention is constructed by connecting in series one or two or more filter functional units each comprising a first surface acoustic wave resonator having input and output terminals connected in series with a signal line and a second surface acoustic wave resonator having input and output terminals one of which is connected to the signal line and the other of which is grounded, and wherein the second surface acoustic wave resonator comprises two or more interdigital transducers connected in parallel.

In this construction, the impedance of the surface acoustic wave resonator comprising two interdigital transducers connected in parallel is one-half, as indicated by a dot-and-dash line in FIG. 14, that of a resonator comprising only one interdigital transducer (indicated by a solid line). Specifically, letting the impedance of the resonator comprising only one interdigital transducer be $Z1(f)$, the impedance $Z3(f)$ of the resonator comprising two interdigital transducers connected in parallel is expressed by the following equation:

$$Z3(f)=Z1(f)/2$$

Even if the impedance characteristics of the first surface acoustic wave resonator are not changed, therefore, the slope thereof becomes steeper, as compared with the impedance characteristics of the second surface acoustic wave resonator, thereby to make it possible to reduce the insertion loss and at the same time, ensure high attenuation outside the band.

Furthermore, a surface acoustic wave filter according to the present invention is constructed on a piezoelectric substrate by disposing on the same propagation path two or more comb-shaped input electrodes and one or more comb-shaped output electrodes for sending and receiving surface acoustic waves and providing a pair of strip type comb-shaped reflectors on the outermost side so as to interpose a group of the input and output electrodes, and wherein one of the pair of strip type comb-shaped reflectors with the group of the input and output electrodes interposed therebetween is connected to the ground and the other comb-shaped reflector is opened.

This makes it possible to reduce a ripple within the passband, as compared with that in the conventional interdigitated interdigital transducer type surface acoustic wave filter of such construction that a pair of comb-shaped reflectors is connected to the around.

The foregoing and other objects, features, aspects and advantages of the present invention will become more apparent from the following detailed description of the present invention.

DESCRIPTION OF THE PREFERRED EMBODIMENTS

Figure 14:
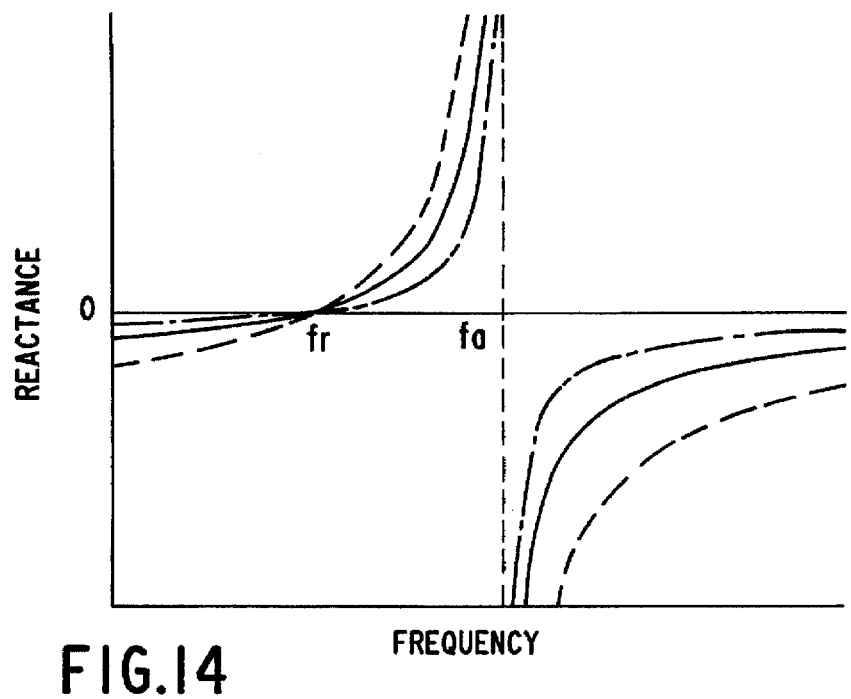
Figure 31:
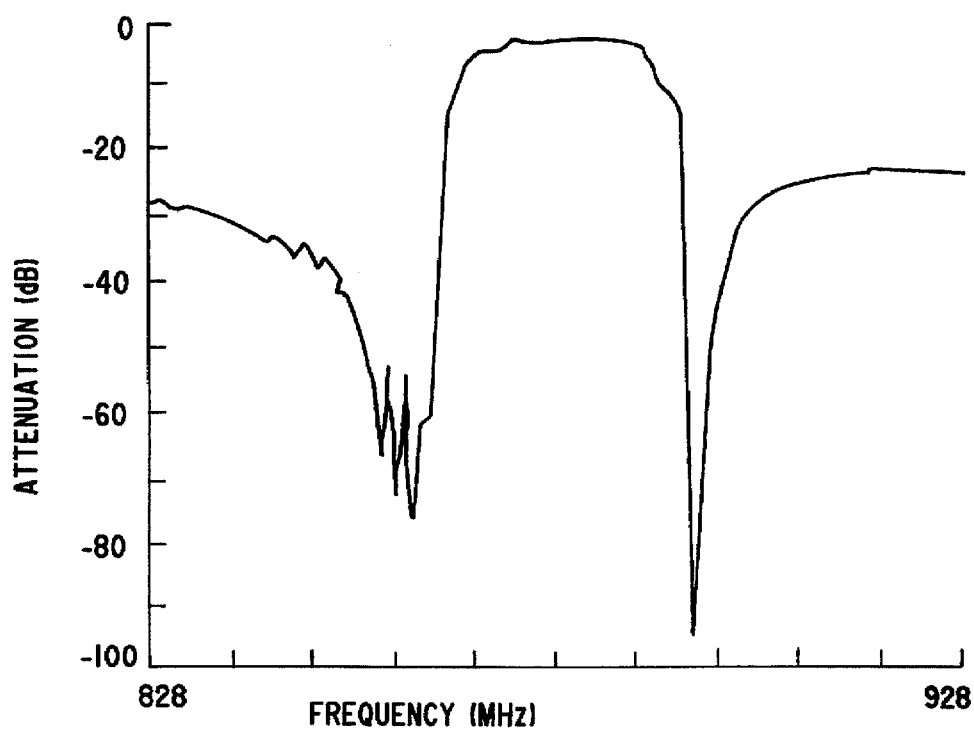
Figure 15:
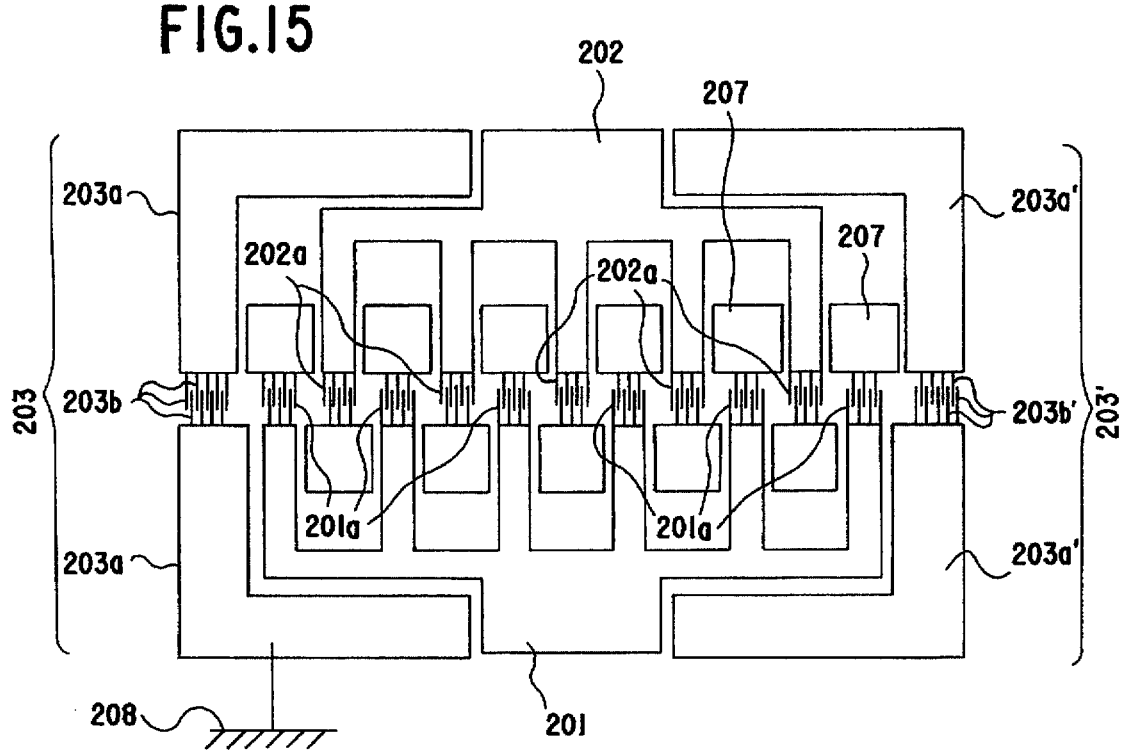
Figure 16:
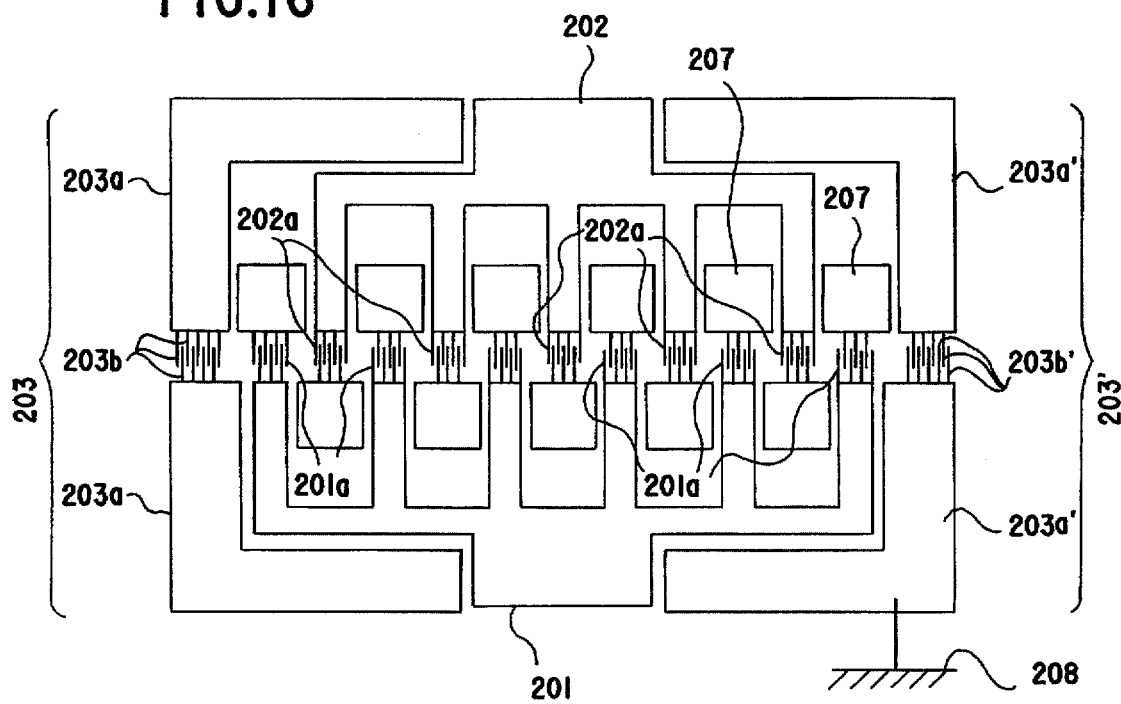
Figure 17:
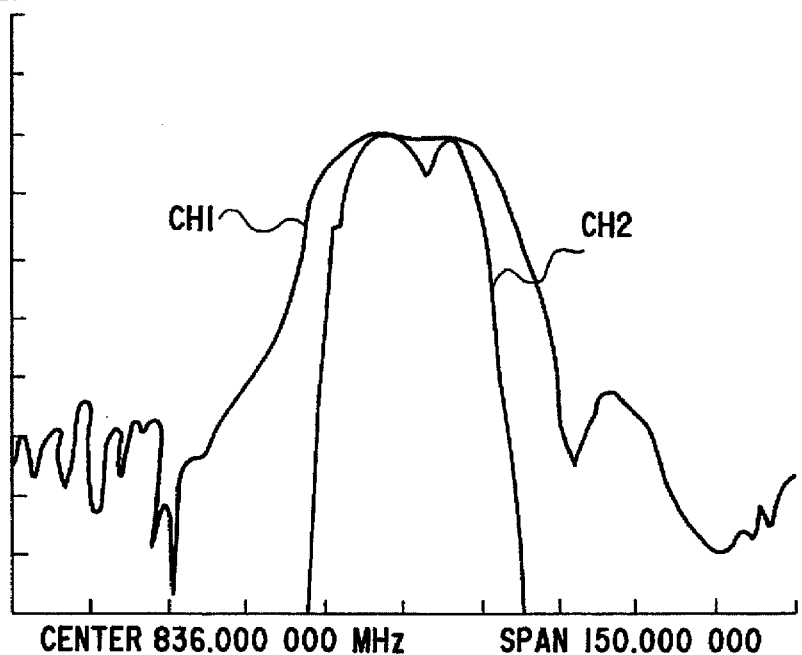
Figure 32:
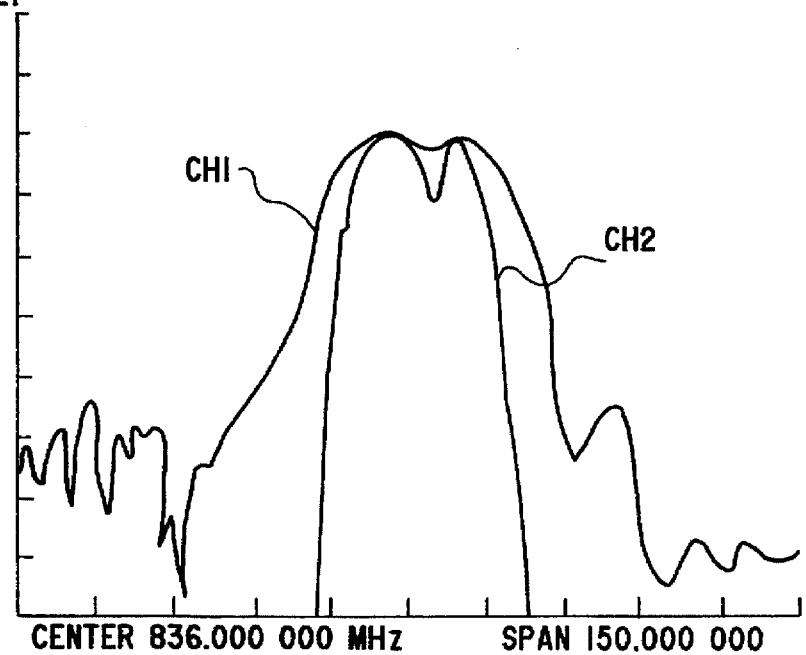
Figure 18:
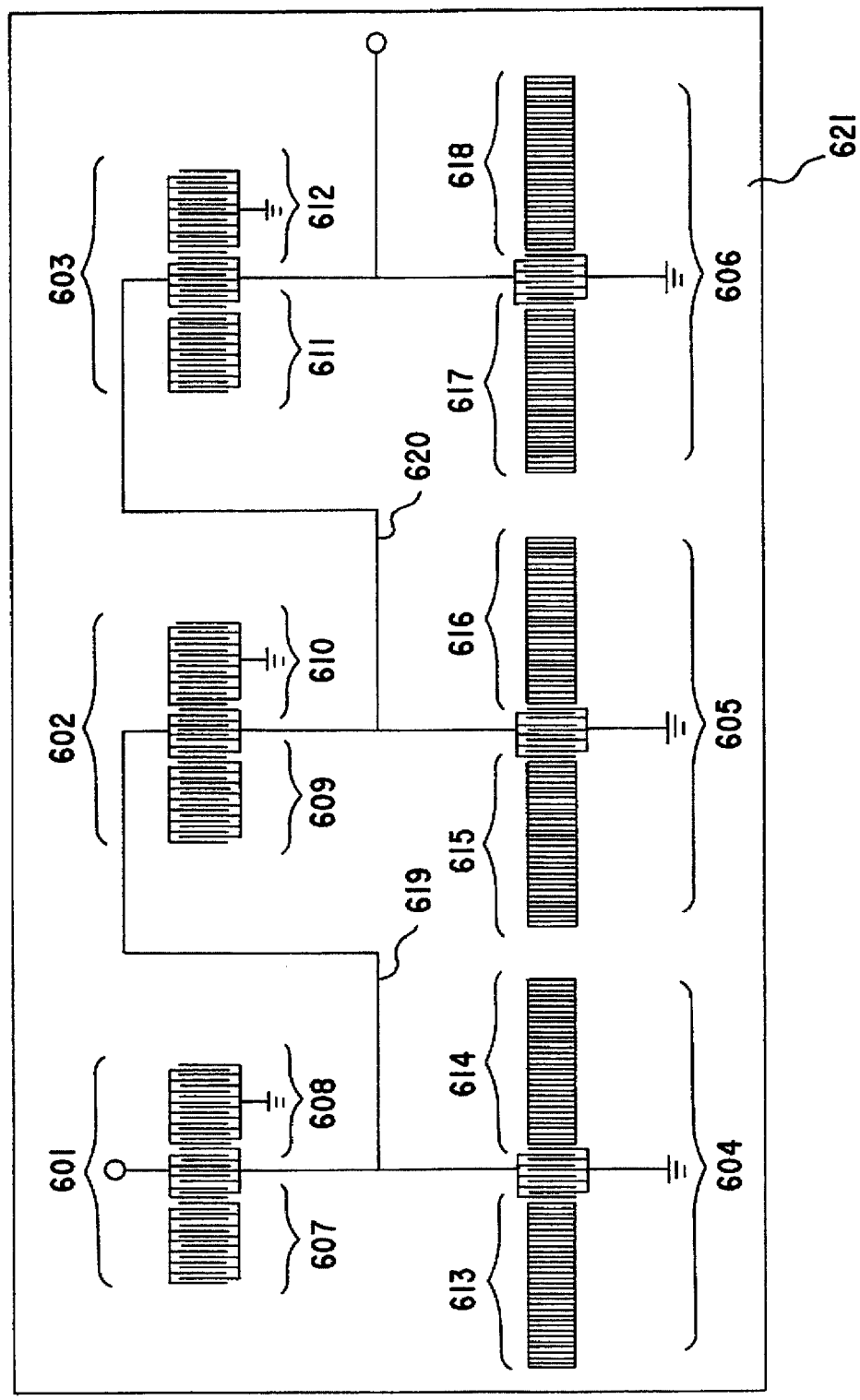
Figure 19:
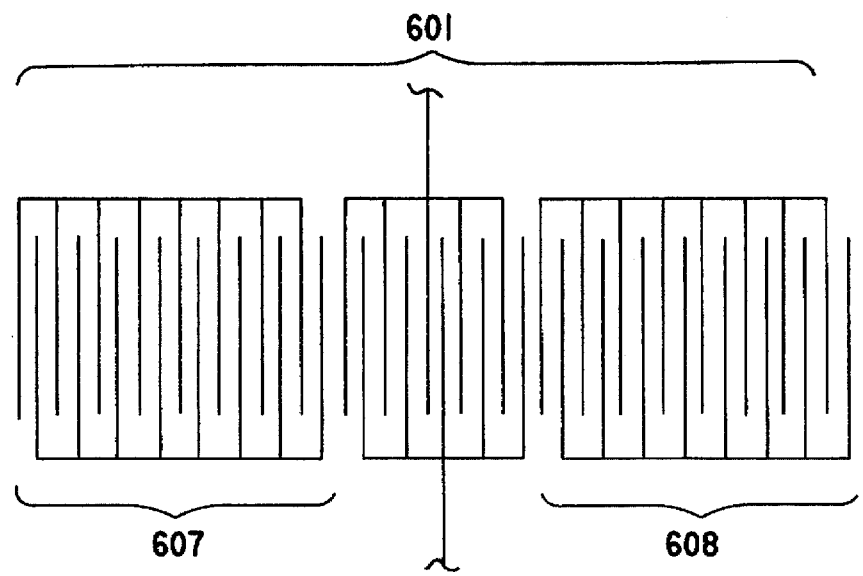
Figure 21:
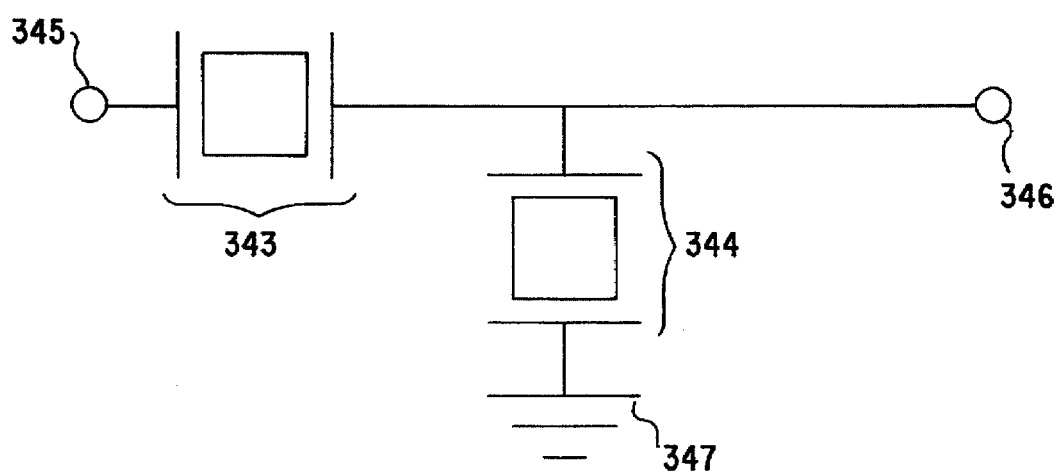
Figure 20:
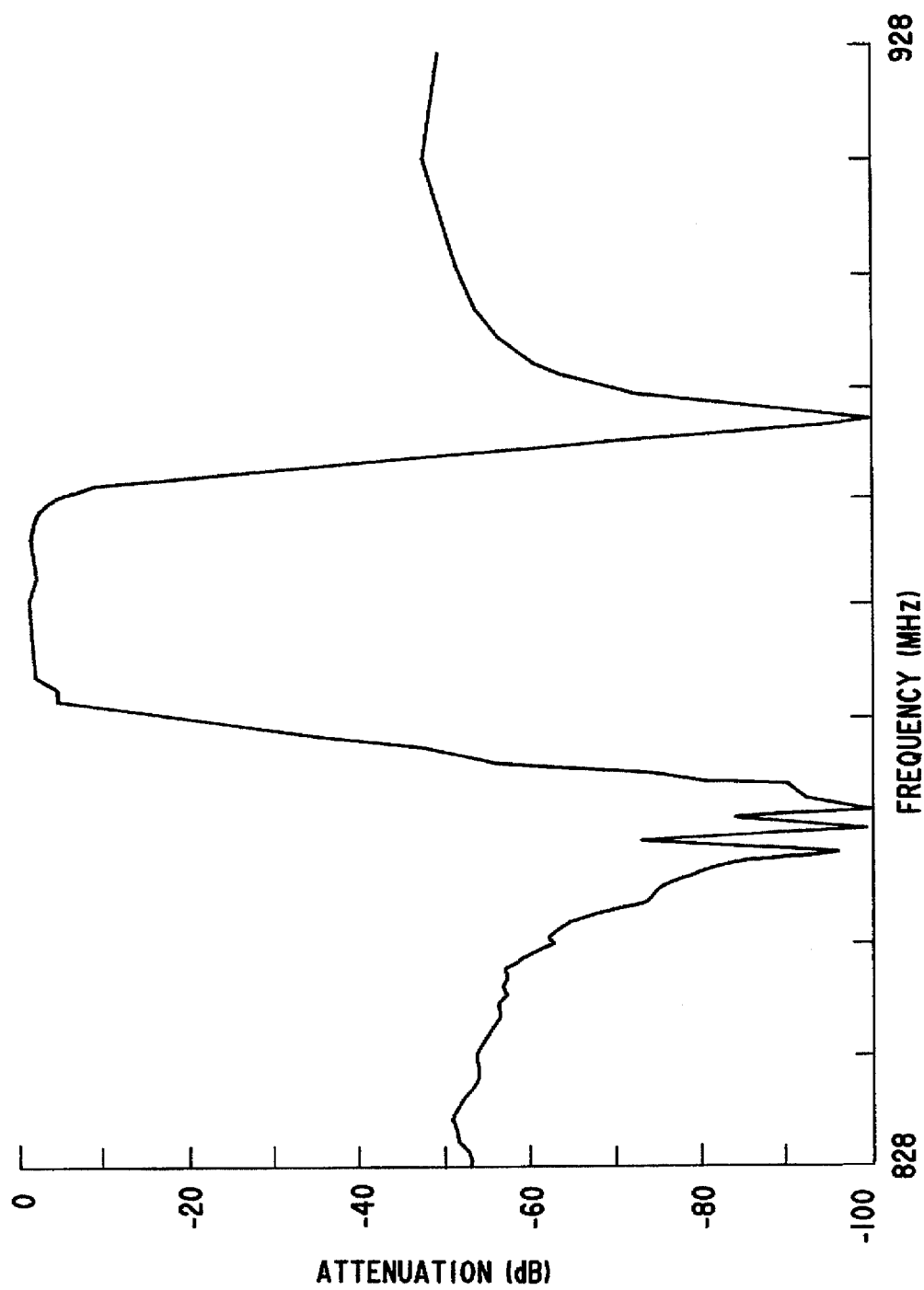
Figure 22:
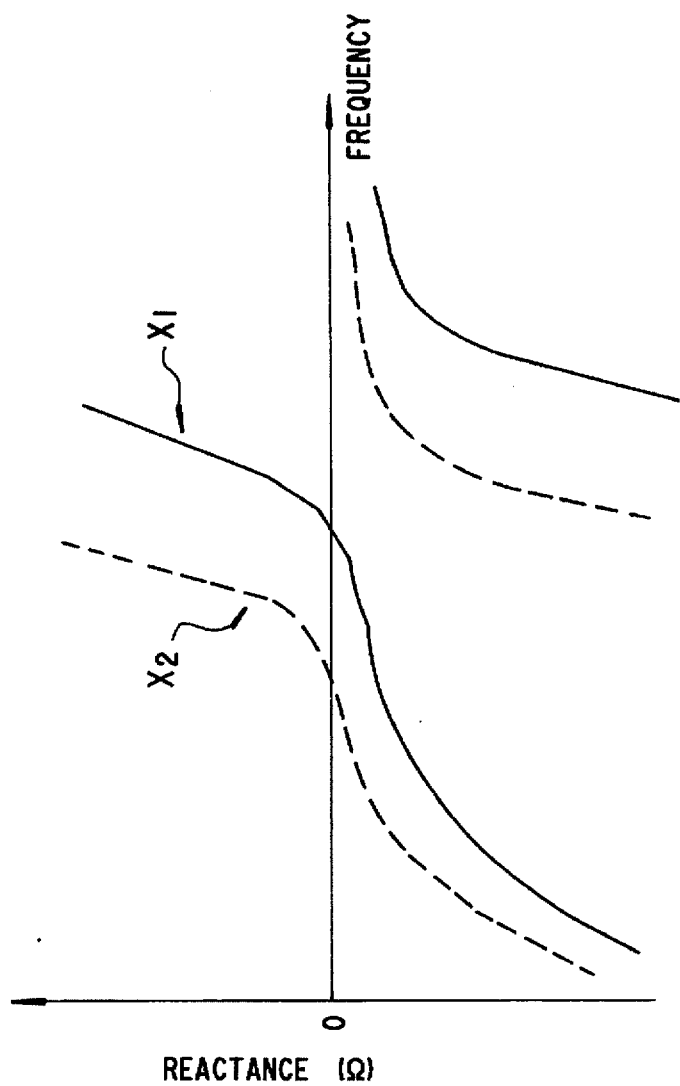
Figure 23:
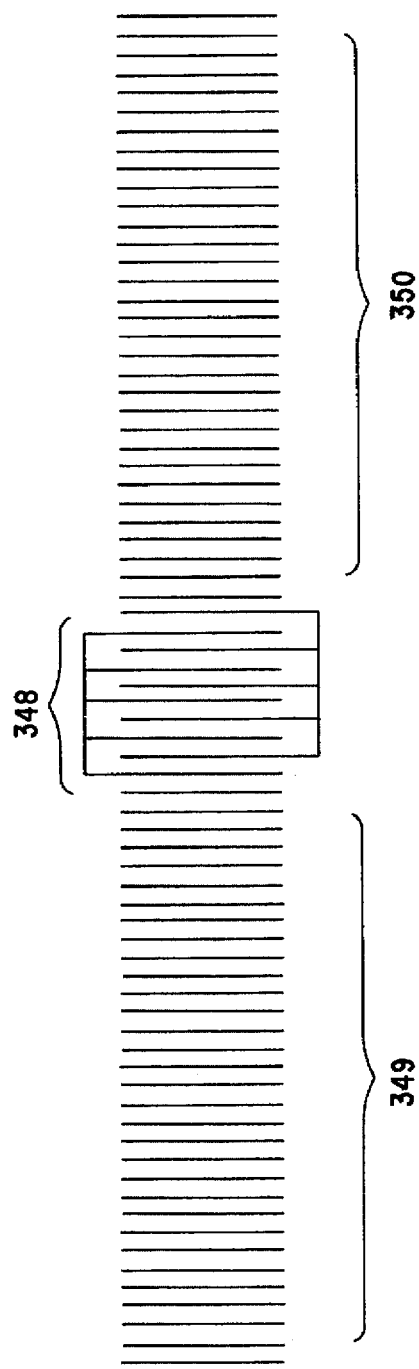
Figure 24:
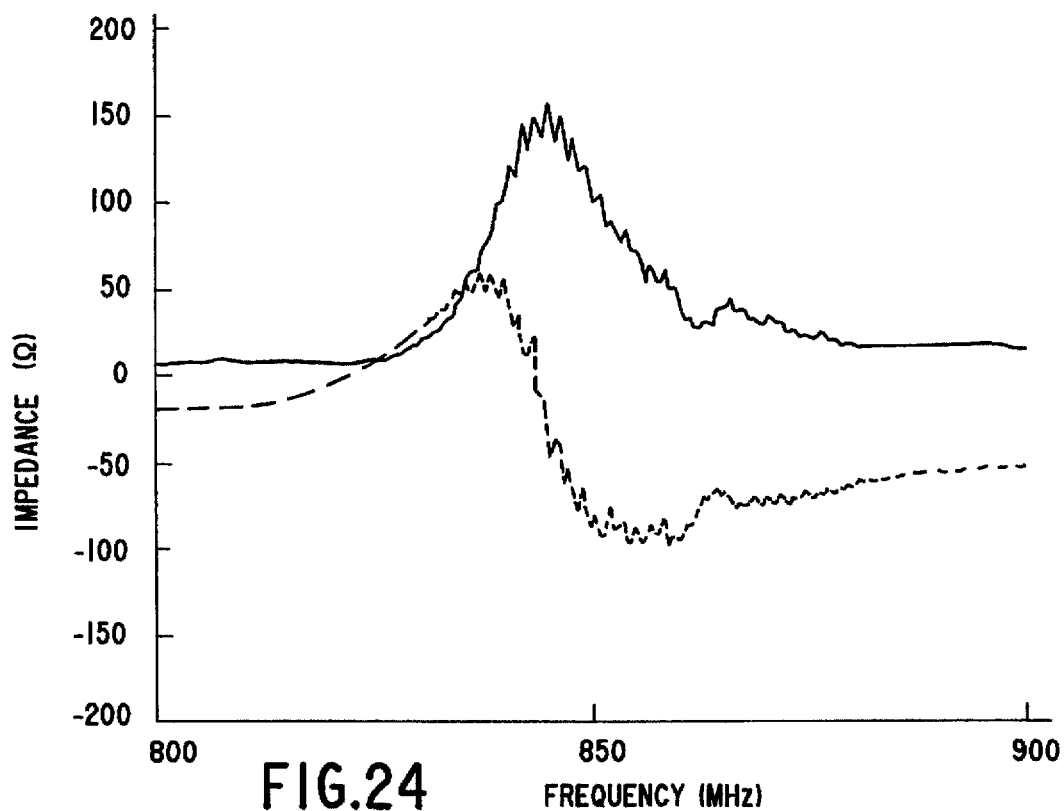
Figure 26:
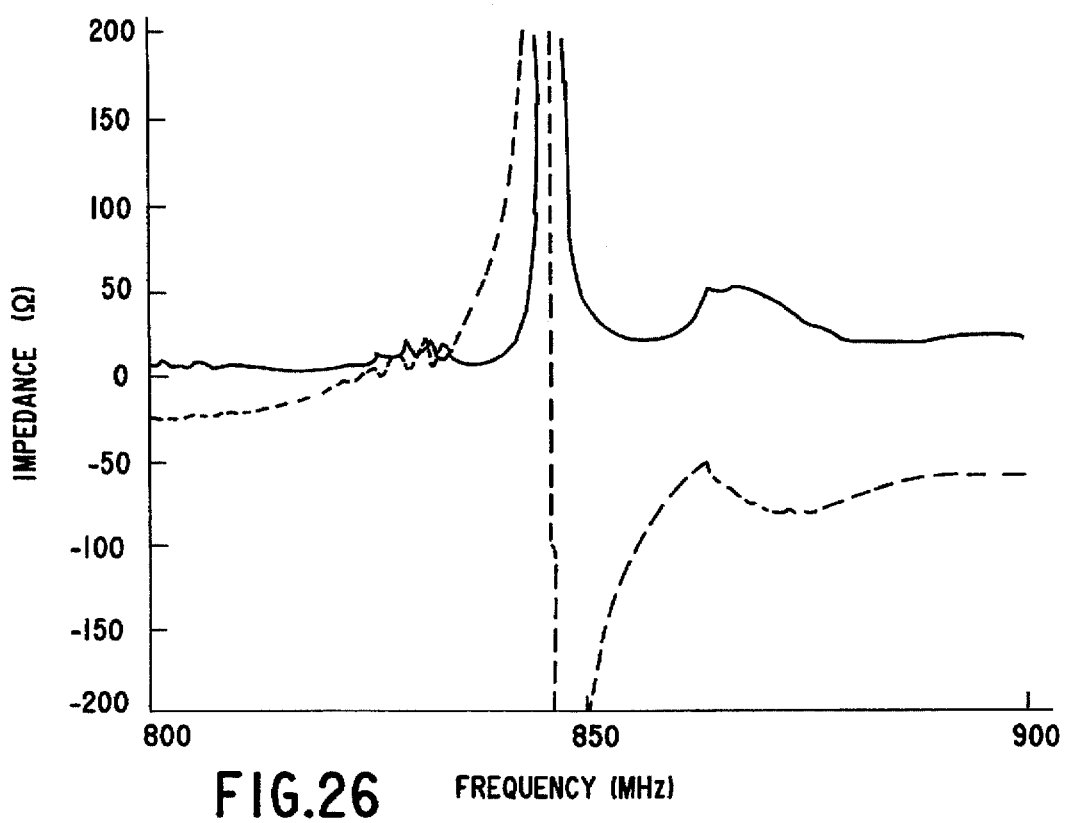
Figure 25:
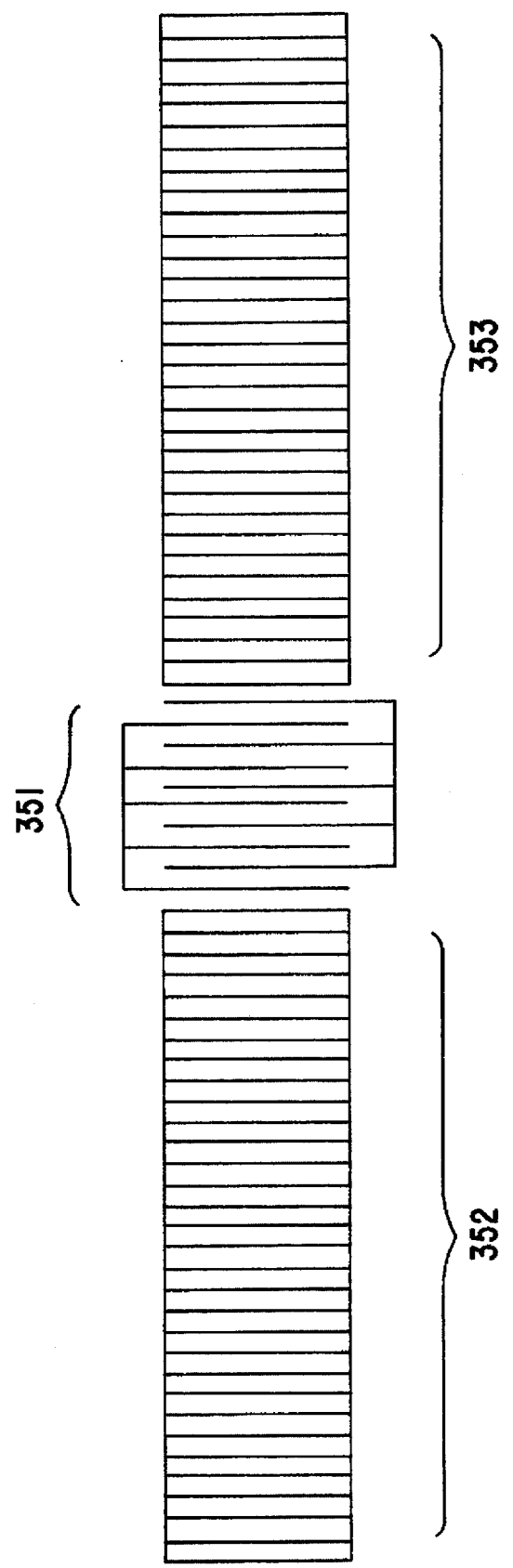
Figure 27:
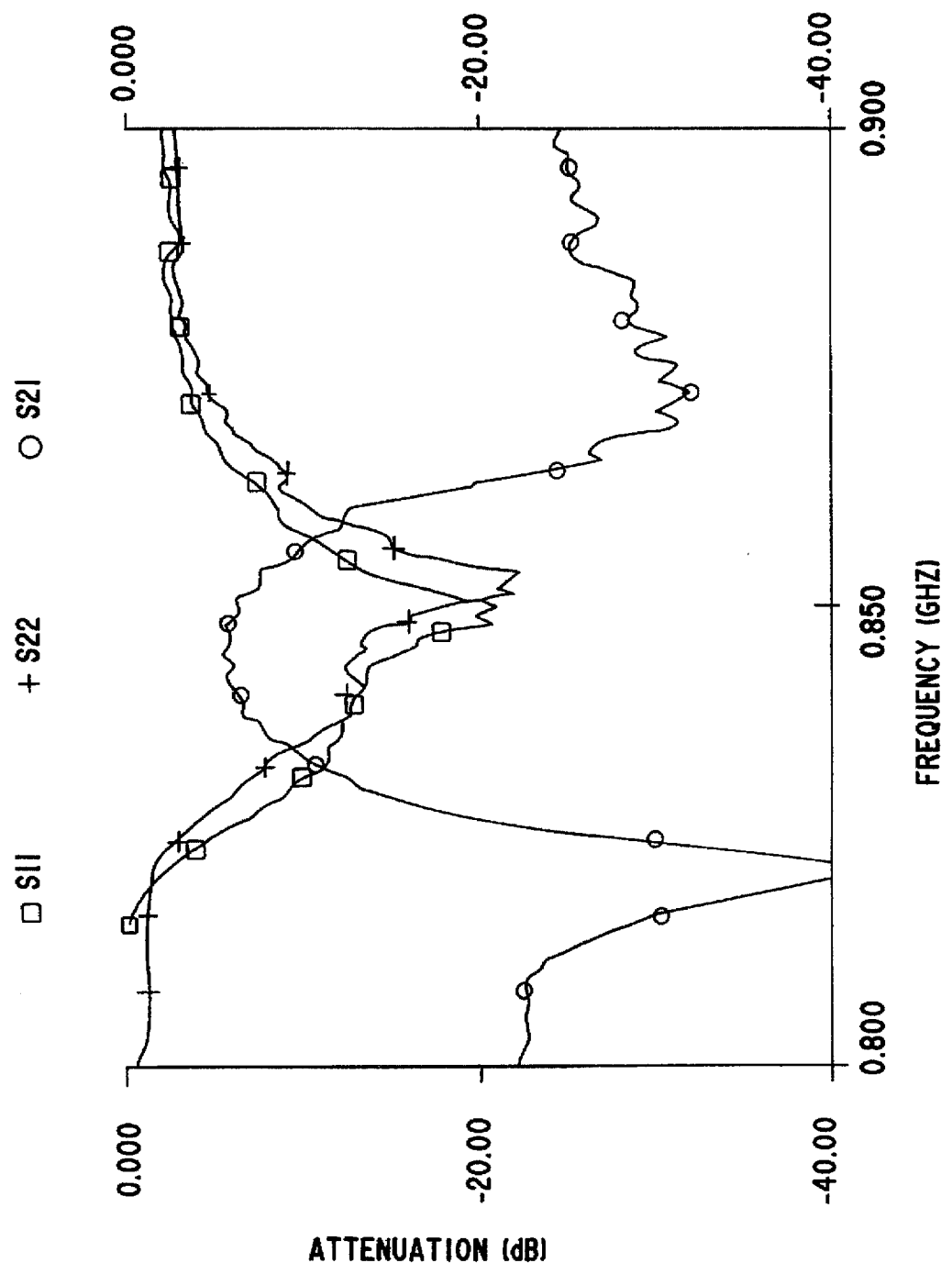
Figure 28:
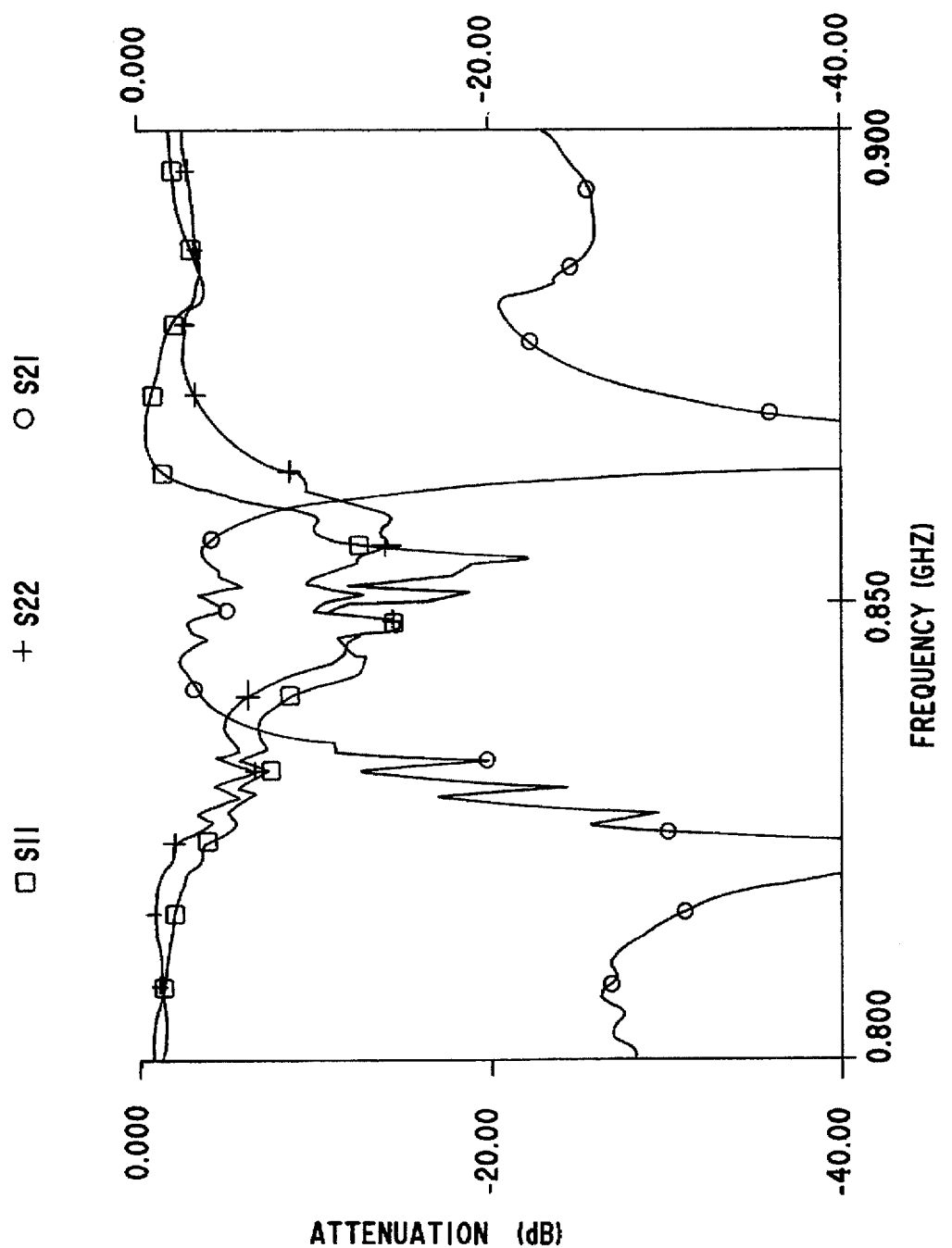
Figure 29:
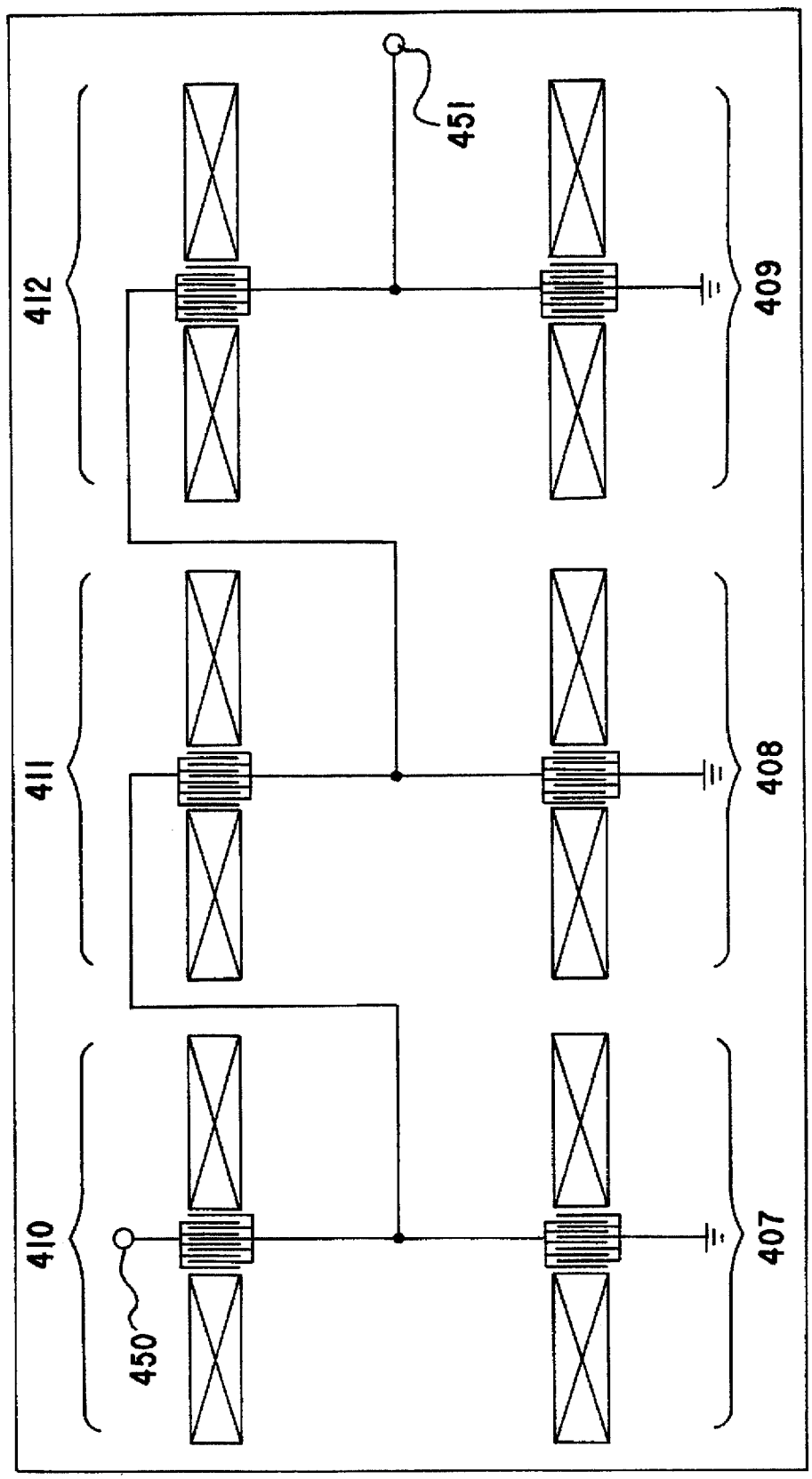
Figure 30:
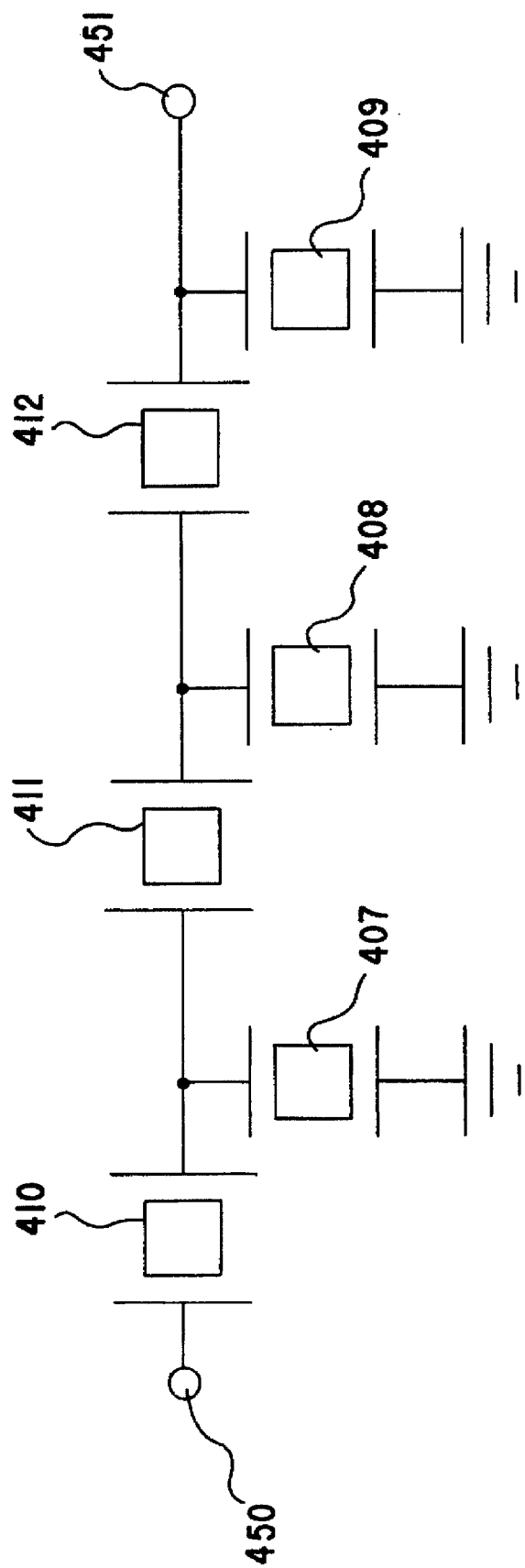
Figure 33:
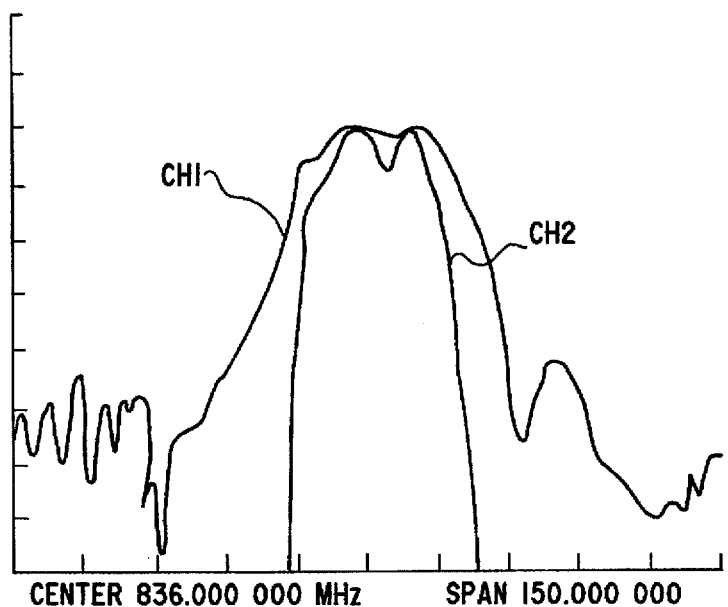
Figure 34:
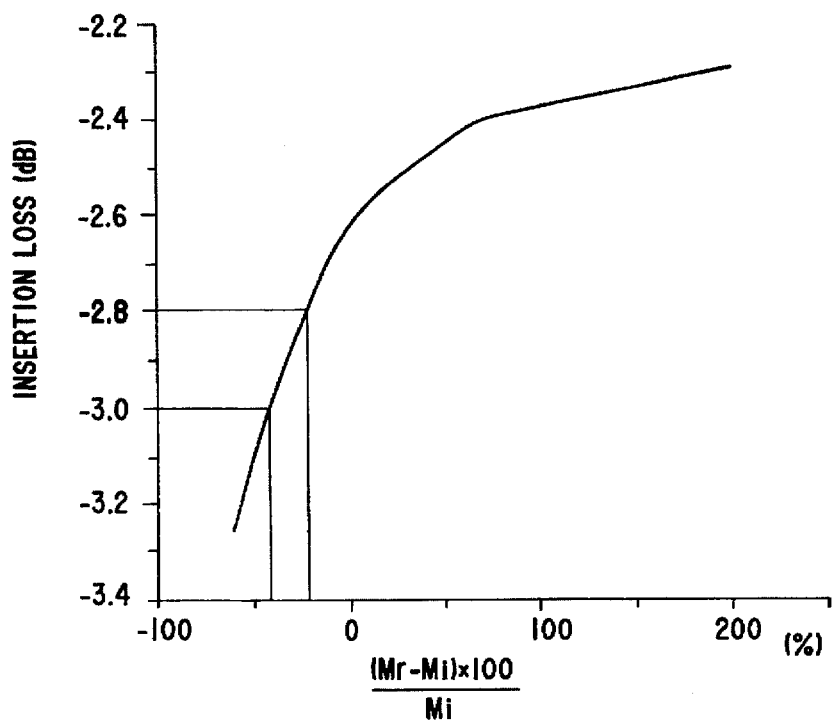
Figure 35:
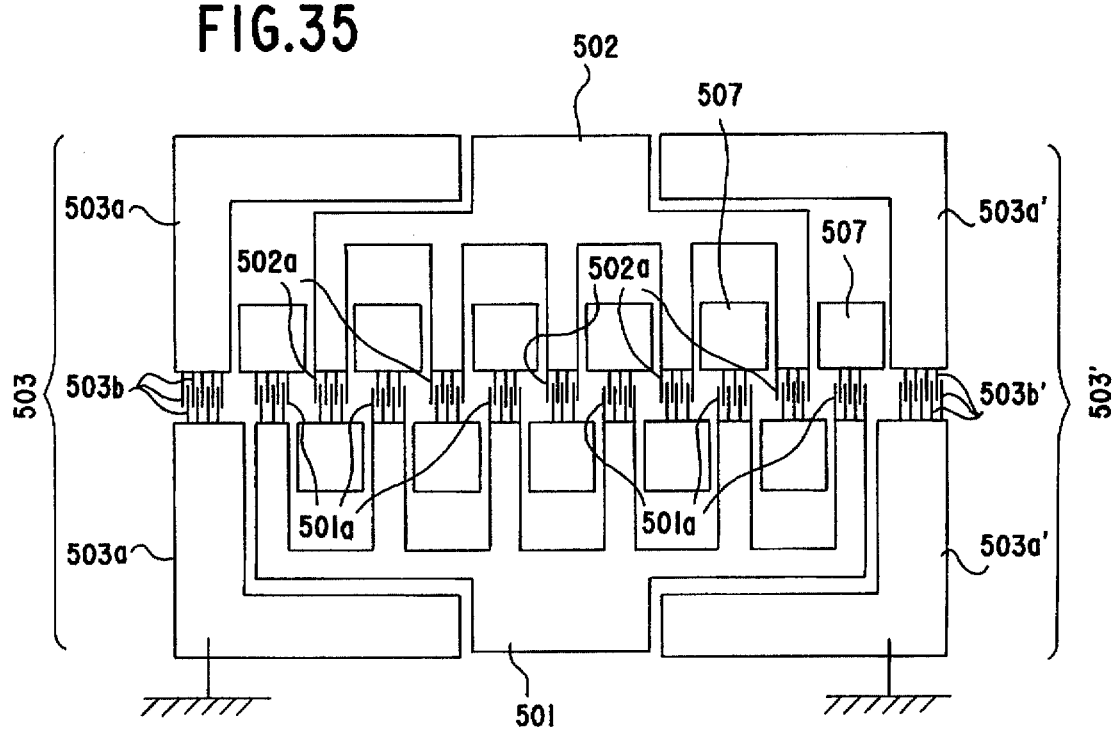
Figure 36:
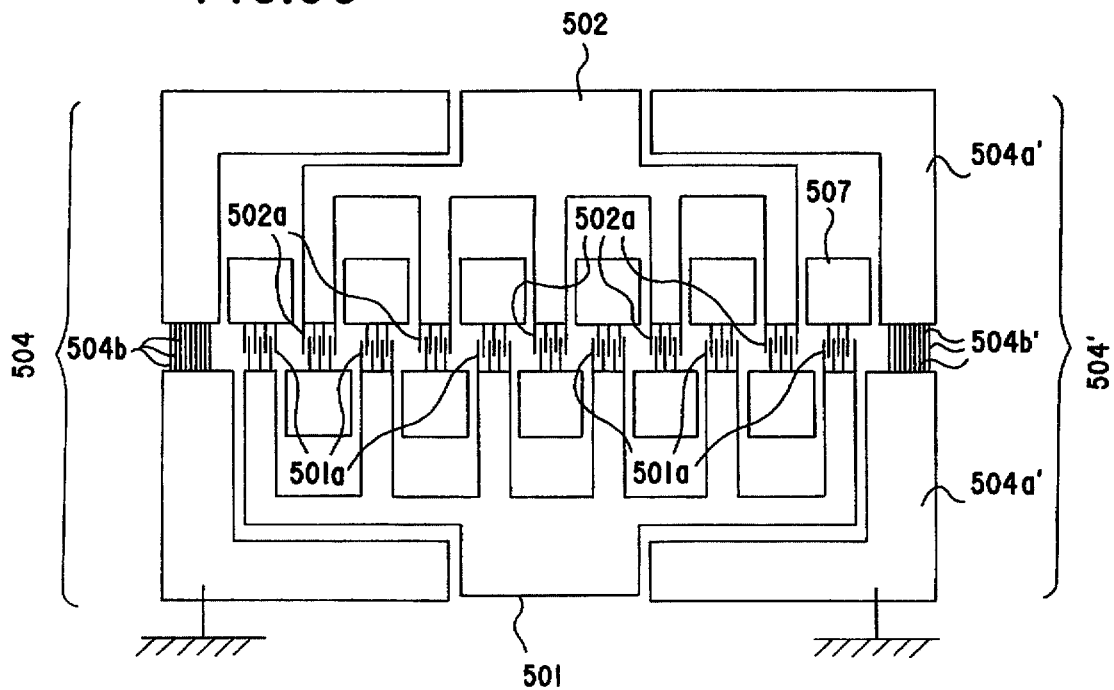

FIG. 14 is a graph respectively showing the impedance characteristics of a surface acoustic wave resonator comprising two interdigital transducers in series (dotted line), the impedance characteristics of a surface acoustic wave resonator comprising two interdigital transducers in parallel (one-dot and dash line), and the impedance characteristics of a surface acoustic wave resonator comprising one interdigital transducer (a solid line);

FIG. 15 is a schematic plan view showing an interdigitated interdigital transducer type surface acoustic wave filter according to a sixth embodiment of the present invention;

FIG. 16 is a schematic plan view showing another example of the interdigitated interdigital transducer type surface acoustic wave filter according to the sixth embodiment of the present invention;

FIG. 17 is a graph showing the pass characteristics of the interdigitated interdigital transducer type surface acoustic way or according to the sixth embodiment of the present invention;

FIG. 18 is a schematic plan view showing a surface acoustic wave filter according to a seventh embodiment of the present invention;

FIG. 19 is a schematic plan view showing in an enlarged manner of of surface acoustic wave resonators each connected in series with a signal line in the surface acoustic wave filter shown in FIG. 18;

FIG. 20 is a diagram showing the frequency characteristics of the surface acoustic wave filter shown in FIG. 18;

FIG. 21 is a circuit diagram showing a filter functional unit constituting a surface acoustic wave filter;

FIG. 22 is a graph showing the impedance characteristics of a surface acoustic wave resonator having ideal double resonance characteristics used for a surface acoustic wave filter;

FIG. 23 is a schematic plan view showing a surface acoustic wave resonator having electrically open strip type grating reflectors;

FIG. 24 is a graph showing the impedance characteristics of the surface acoustic wave resonator shown in FIG. 23;

FIG. 25 is a schematic plan view showing a surface acoustic wave resonator having electrically short strip type grating reflectors;

FIG. 26 is a graph showing the impedance characteristics of the surface acoustic wave resonator shown in FIG. 25;

FIG. 27 is a graph showing the frequency characteristics of a conventional surface acoustic wave filter comprising only the surface acoustic wave resonator having the electrically open strip type grating reflector shown in FIG 23;

FIG. 28 is a graph showing the frequency characteristics of a conventional surface acoustic wave filter comprising only the surface acoustic wave resonator having the electrically open strip type grating reflector shown in FIG 25;

FIG. 29 is a schematic plan view showing a conventional surface acoustic wave filter;

FIG. 30 is a diagram showing an equivalent circuit of the surface acoustic wave filter shown in FIG. 29;

FIG. 31 is a diagram showing the frequency characteristics of the surface acoustic wave filter shown in FIG. 29;

FIG. 32 is a graph showing the pass characteristics of a conventional interdigitated interdigital transducer type surface acoustic wave filter having comb-shaped reflectors (of such a type ground both the comb-shaped reflectors);

FIG. 33 is a graph showing the pass characteristics of the conventional interdigitated interdigital transducer type surface acoustic wave filter having comb-shaped reflectors in a case where both the comb-shaped reflectors are not grounded;

FIG. 34 is a graph showing the relationship between the ratio of the number of reflectors to the minimum number of input electrodes and the insertion loss;

FIG. 35 is a schematic plan view showing a conventional interdigitated interdigital transducer type surface acoustic wave filter having comb-shaped reflectors (of such a type as to ground both the comb-shaped reflectors); and FIG. 36 is a schematic plan view showing a conventional interdigitated interdigital transducer type surface acoustic wave filter having grating reflectors (of such a type as to ground both the grating reflectors).

DETAILED DESCRIPTION OF THE PREFERRED EMBODIMENTS (Embodiment 1)

Figure 1:
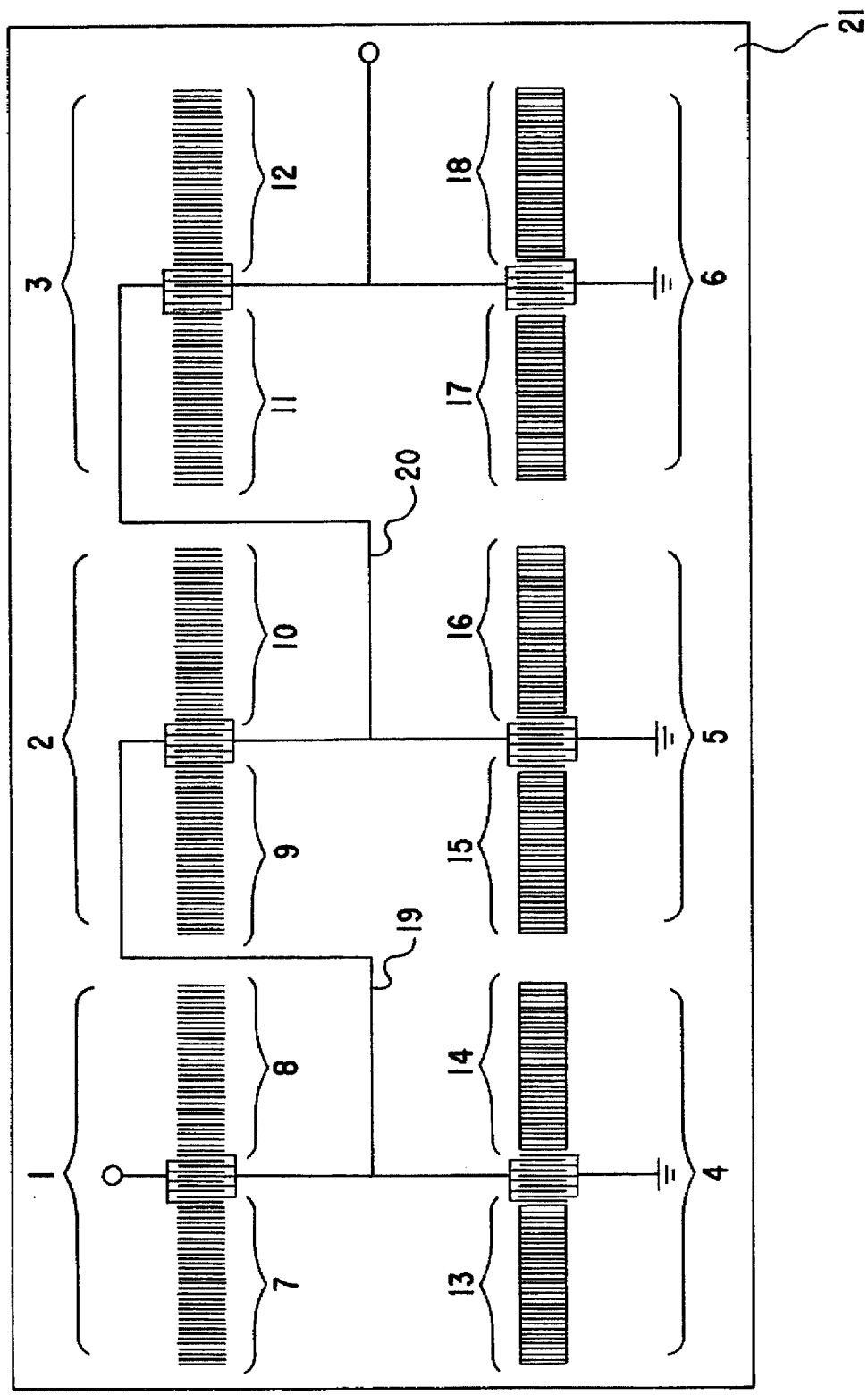
FIGS. 1 is a schematic plan view showing a surface acoustic wave filter according to a first embodiment of the present invention.

A first embodiment will be described on the basis of FIGS. 1 and 2. As shown in FIG. 1, a surface acoustic wave high-frequency filter is constructed by connecting in series a first filter functional unit comprising surface acoustic wave resonators 1 and 4, a second filter functional unit comprising surface acoustic wave resonators 2 and 5, and a third filter functional unit comprising surface acoustic wave resonators 3 and 6. The first to third filter functional units are formed on a piezoelectric substrate composed of lithium tantalate.

Each of the surface acoustic wave resonators 1 to 6 is constituted by one interdigital transducer and a pair of strip type grating reflectors with the interdigital transducer interposed therebetween. In addition, each of the surface acoustic wave resonators 1, 2 and 3 has input and output terminals, which are connected in series with a signal line 19 or 20. On the other hand, each of the surface acoustic wave resonators 4, 5 and 6 has input and output terminals, one of which is connected to the signal line 19 or the signal line 20 and the other of which is grounded.

Strip type grating reflectors 7, 8, 9, 10, 11 and 12 in the surface acoustic wave resonators 1 to 3 each connected in series with the signal line out of the surface acoustic wave resonators 1 to 6 are constructed in an electrically open type. On the other hand, strip type grating reflectors 13, 14, 15, 16, 17 and 18 in the surface acoustic wave resonators 4 to 6 each connected in parallel with the signal line are constructed in an electrically short type.

The resonance frequency of each of the surface acoustic wave resonators 1 to 3 is 846 MHz, and the antiresonance frequency thereof is 868 MHz. On the other hand, the resonance frequency of each of the surface acoustic wave resonators 4 to 6 is 824 MHz, and the antiresonance frequency thereof is 846 MHz.

Figure 2:
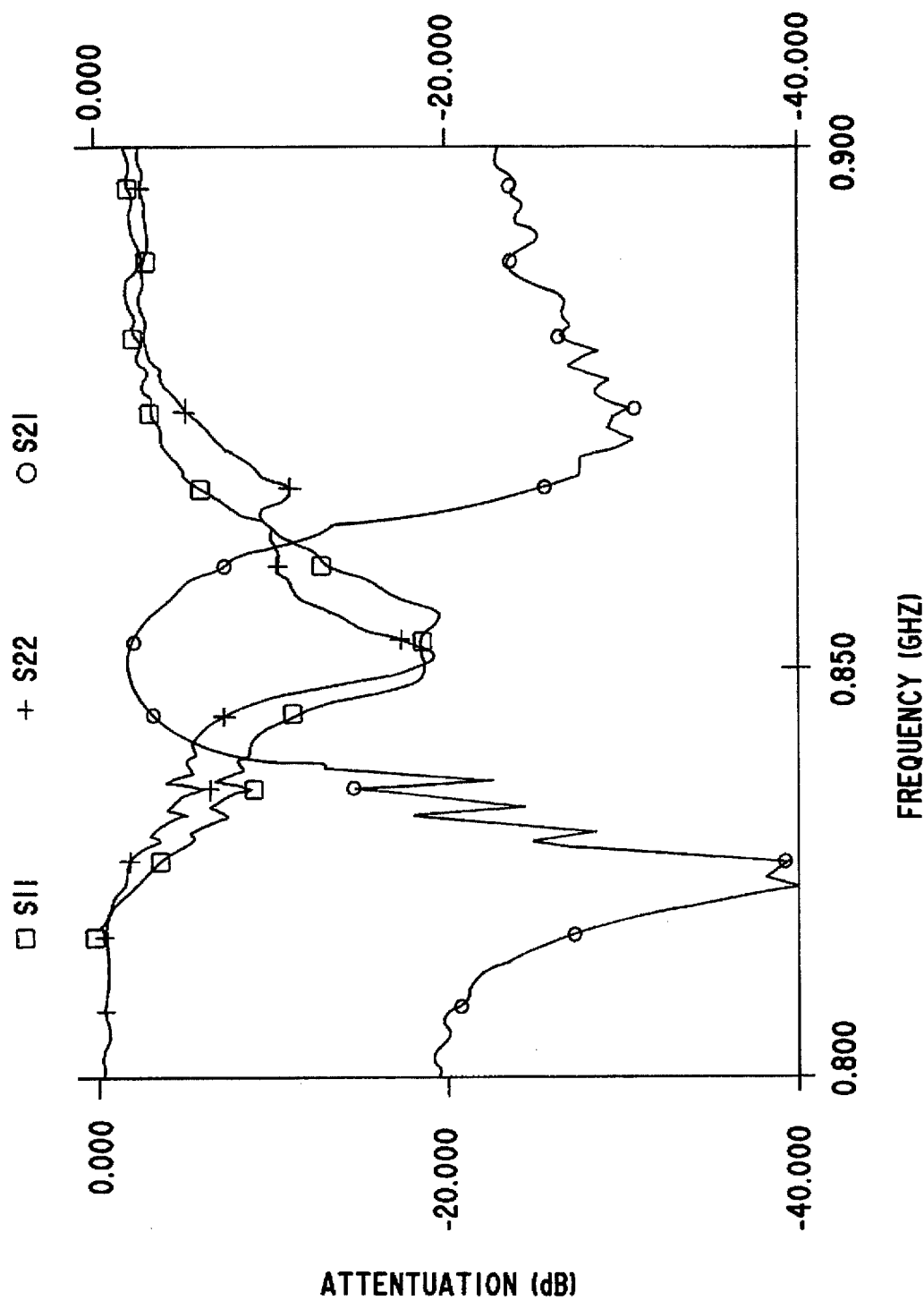
FIG. 2 is a graph showing the frequency characteristics of the surface acoustic wave filter shown in FIG. 1.

FIG. 2 is a graph showing the frequency characteristics of the surface acoustic wave high-frequency filter of the above described construction. As apparent from comparison with the characteristics of the filter using only electorally short strip type grating reflectors shown in FIG. 28, the insertion loss in the passband is 2.5 dB and the ripple is 2.3 dB in the conventional filter shown in FIG. 28, while the insertion loss is 2.0 dB and the ripple is almost removed in the surface acoustic wave filter of the above described construction, which is improved over the conventional filter.

Specifically, such characteristics that there is no distortion of impedance at a resonance point of the resonator having the electrically open strip type grating reflectors and such characteristics that there is no distortion of impedance at an antiresonance point of the resonator having the electrically short strip type grating reflectors are made use of in the passband.

(Embodiment 2)

Figure 3:
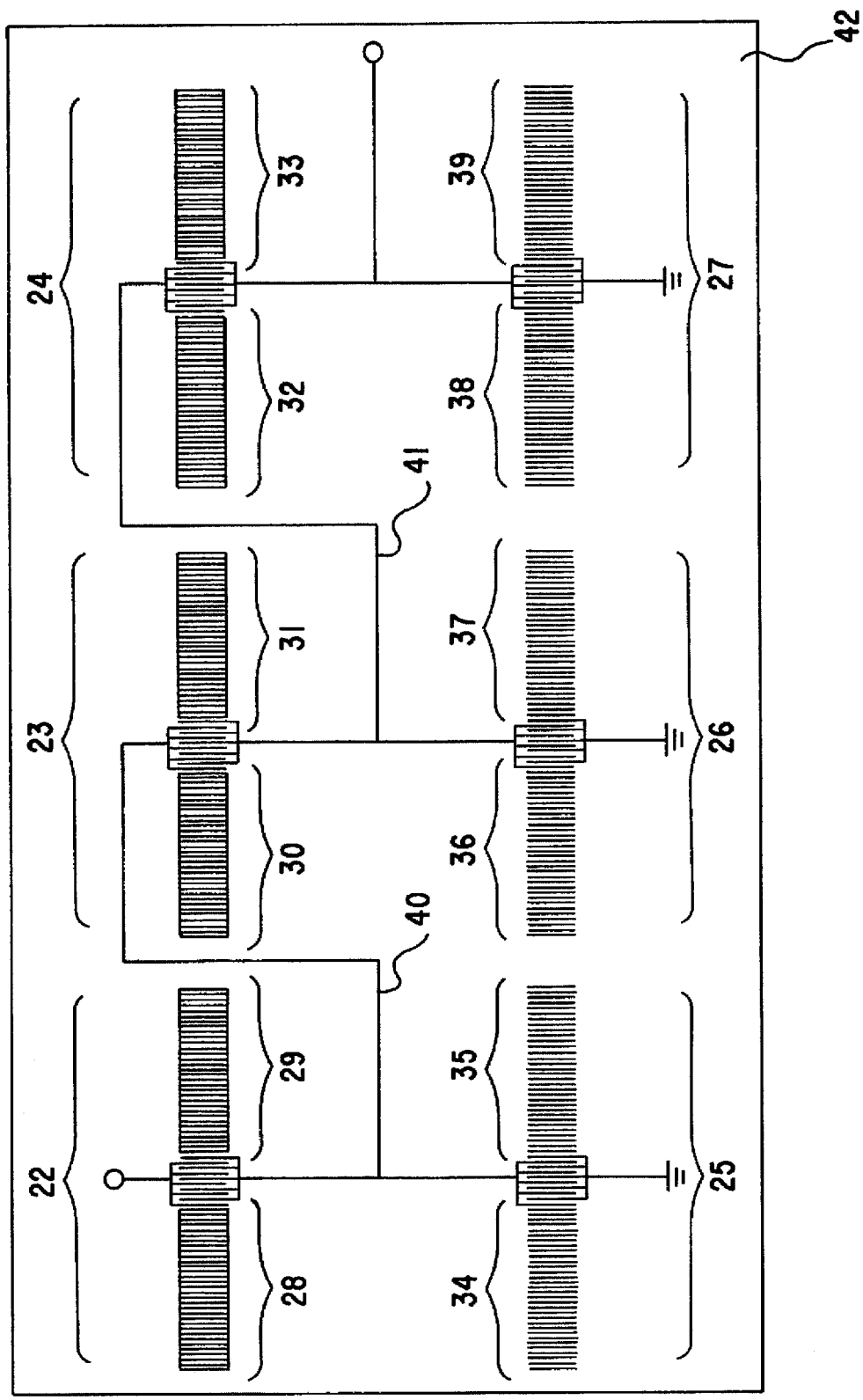
FIG. 3 is a schematic plan view showing a surface acoustic wave filter according to a second embodiment of the present invention.

A second embodiment of the present invention will be described on the basis of FIGS. 3 and 4. A surface acoustic wave filter according to the present embodiment is constructed by connecting in series a first filter functional unit comprising surface acoustic wave resonators 22 and 25, a second filter functional unit comprising surface acoustic wave resonators 23 and 26, and a third filter functional unit comprising surface acoustic wave resonators 24 and 27.

The surface acoustic wave resonators 22 to 24 each connected in series with a signal line 40 or 41 have electrically short strip type grating reflectors 28, 29, 30, 31, 32 and 33, and the surface acoustic wave resonators 25 to 27 each connected in parallel with the signal line 40 or 41 have electrically open strip type grating reflectors 34, 35, 36, 37, 38 and 39.

Specifically, the relationship between opening and short-circuiting in the strip type grating reflectors is the reverse of that in the embodiment 1.

The resonance frequency of each of the surface acoustic wave resonators 22 to 24 is 846 MHz, and the antiresonance frequency thereof is 868 MHz. On the other hand, the resonance frequency of each of the surface acoustic wave resonators 25 to 27 is 824 MHz, and the antiresonance frequency thereof is 846 MHz.

Figure 4:
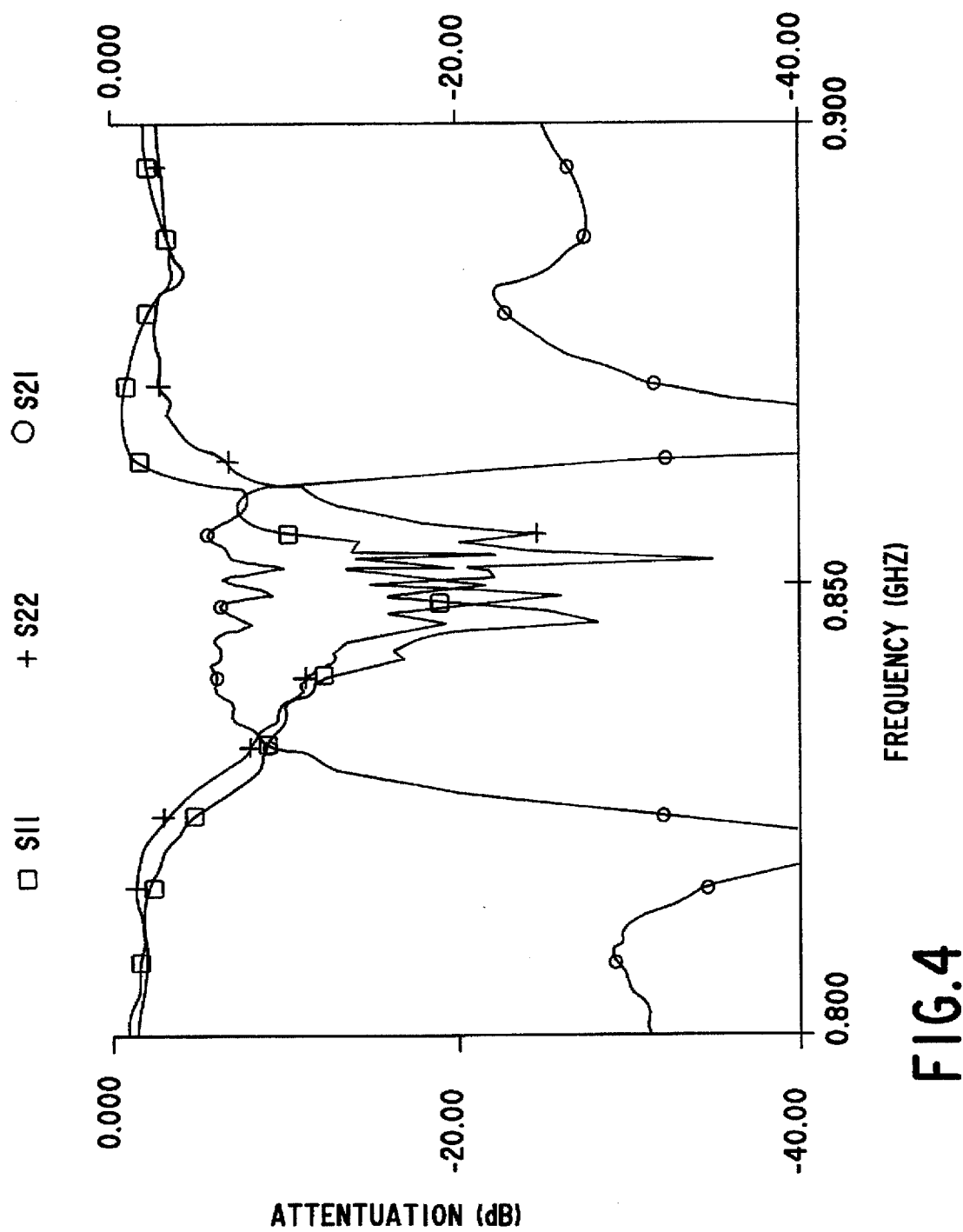
FIG. 4 is a graph showing the frequency characteristics of the surface acoustic wave filter shown in FIG. 3.

FIG. 4 shows the frequency characteristics of the surface acoustic wave high-frequency filter of the above described construction. It is found that the attenuation on the side of low frequencies is improved by 3 dB and the attenuation on the side of high frequencies is improved by 2 dB, as compared with those in the characteristics of the conventional filter using only electrically short strip type grating reflectors shown in FIG. 28.

Specifically, such characteristics that there is no distortion of impedance at a resonance point of the resonator having the electrically open strip type grating reflectors and such characteristics that there is no distortion of impedance at an antiresonance point of the resonator having the electrically short strip type grating reflectors are made use of in an attenuation pole of the filter.

As described in the foregoing first and second embodiments, it is possible to improve the characteristics of the surface acoustic wave high-frequency filter to ideal characteristics. Since the surface acoustic wave resonator itself used for the filter is existing one, no development costs of a new surface acoustic wave resonator are required, thereby to reduce the costs of the filter.

(Embodiment 3)

Figure 5:
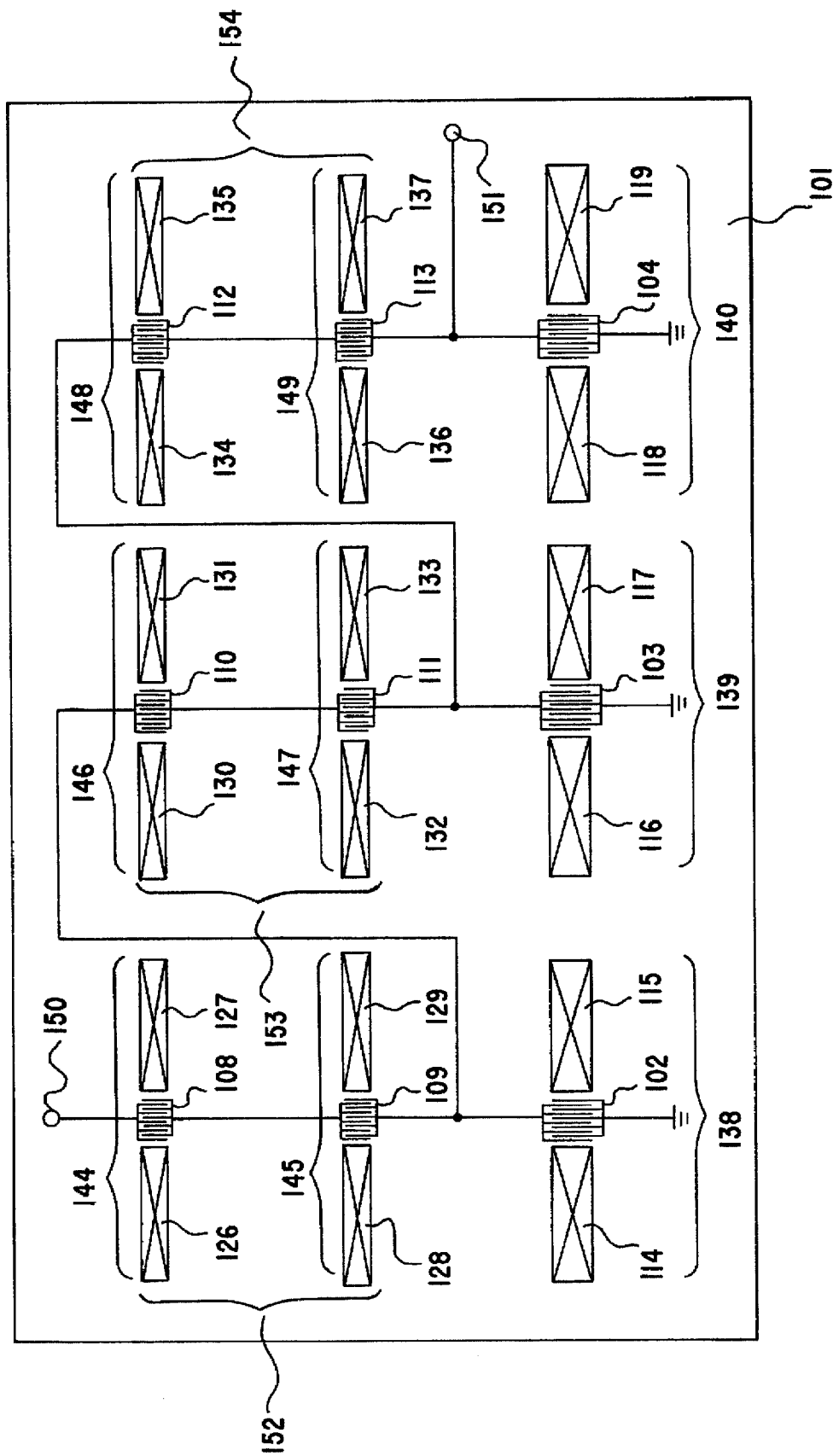
FIG. 5 is a schematic plan view showing a surface acoustic wave filter according to a third embodiment of the present invention.
Figure 6:
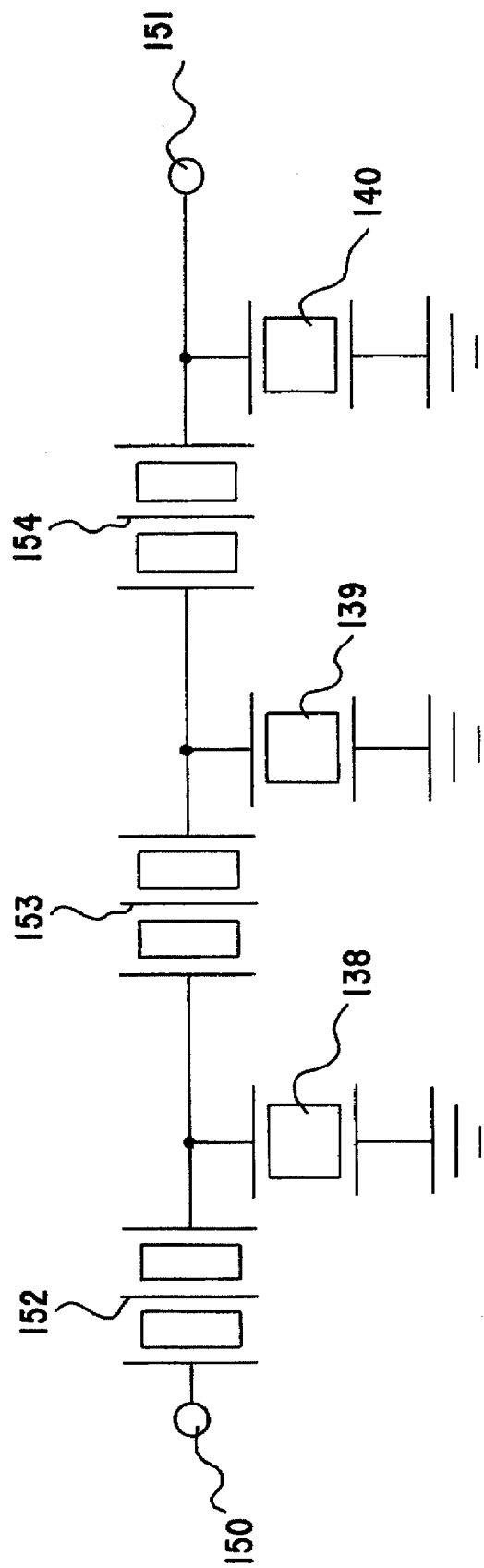
FIG. 6 is a diagram showing an equivalent circuit of the surface acoustic wave filter shown in FIG. 5.

A third embodiment of the present invention will be described on the basis of FIGS. 5 to 7. As shown in FIGS. 5 and 6, a surface acoustic wave high-frequency filter is constructed by connecting in series a first filter functional unit comprising surface acoustic wave resonators 138 and 152, a second filter functional unit comprising surface acoustic wave resonators 139 and 153, and a third filter functional unit comprising surface acoustic wave resonators 140 and 154. The first to third filter functional units are formed on a piezoelectric substrate 101 composed of lithium tantalate.

Each of the surface acoustic wave resonators 152, 153 and 154 has input and output terminals, which are connected in series with a signal line. On the other hand, each of the surface acoustic wave resonators 138, 139 and 140 has input and output terminals, one of which is connected to the signal line and the other of which is grounded. In addition, the surface acoustic wave high-frequency filter has an input terminal 150 and an output terminal 151.

The surface acoustic wave resonators 138 to 140 each connected in parallel with the signal line respectively comprise one interdigital transducers 102, 103 and 104 and a pair of strip type grating reflectors 114 and 115, 116 and 117 and 118 and 119 with the interdigital transducer interposed therebetween.

On the other hand, out of the surface acoustic wave resonators 152 to 154 each connected in series with the signal line, the surface acoustic wave resonator 152 comprises interdigital transducers 108 and 109 connected in series, the surface acoustic wave resonator 153 comprises interdigital transducers 110 and 111 connected in series, and the surface acoustic wave resonator 154 comprises interdigital transducers 112 and 113 connected in series. Pairs of strip type grating reflectors 126 and 127, 128 and 129, 130 and 131, 132 and 133, 134 and 135 and 136 and 137 are so provided as to respectively interpose the interdigital transducers 108 to 113.

Specifically, the surface acoustic wave resonator 152 comprises surface acoustic wave resonators 144 and 145 connected in series, the surface acoustic wave resonator 153 comprises surface acoustic wave resonators 146 and 147 connected in series, and the surface acoustic wave resonator 154 comprises surface acoustic wave resonators 148 and 149 connected in series.

The number of electrode fingers in each of the interdigital transducers 102 to 104 and 108 to 113 is 100. The cross width of the electrode fingers in each of the interdigital transducers 102 to 104 is 200 μm, and the cross width of the electrode fingers in each of the interdigital transducers 108 to 113 is 100 μm.

Furthermore, the number of electrode fingers in each of the strip type grating reflectors 114 to 119 and 126 to 137 is 180.

In the above described construction, the impedance of each of the surface acoustic wave resonators 152 to 154 each connected in series with the signal line is four times the impedance of each of the surface acoustic wave resonators 138 to 140 each connected in parallel with the signal line, and the frequency characteristics thereof become steeper. The reason why the impedance becomes four times is that the surface acoustic wave resonators 152 to 154 comprise respective two interdigital transducers 144 and 145, 146 and 147 and 148 and 149 connected in series, and the cross width of electrode fingers in each of the interdigital transducers is one-half the cross width of electrode fingers in each of the surface acoustic wave resonators 138 to 140.

Since the slope of the impedance characteristics thus become steep without moving a resonance point and an antiresonance point, it is possible to reduce the insertion loss and at the same time, to obtain high attenuation outside the band.

Figure 7:
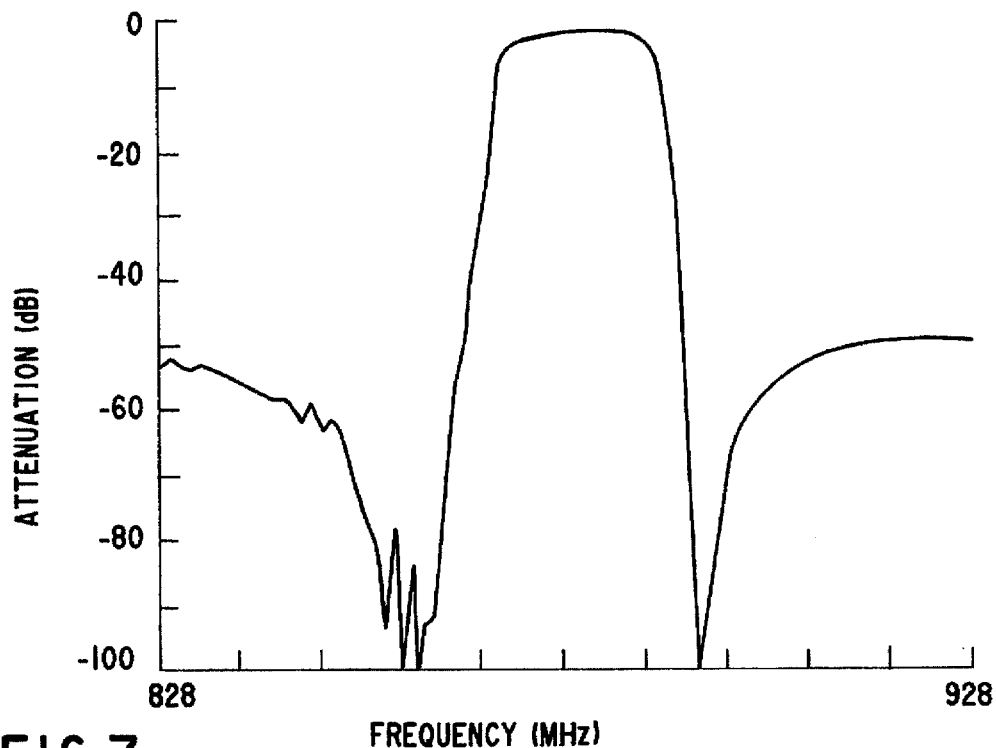
FIG. 7 is a graph showing the frequency characteristics of the surface acoustic wave filter shown in FIG. 5.

FIG. 7 is a graph showing the frequency characteristics of the surface acoustic wave high-frequency filter of the above described construction. It is found that the out-of-band attenuation is increased by not less than 20 dB from comparison with the graph of FIG. 31 showing the frequency characteristics of the surface acoustic wave filter of the conventional construction shown in FIG. 29.

(Embodiment 4)

Figure 8:
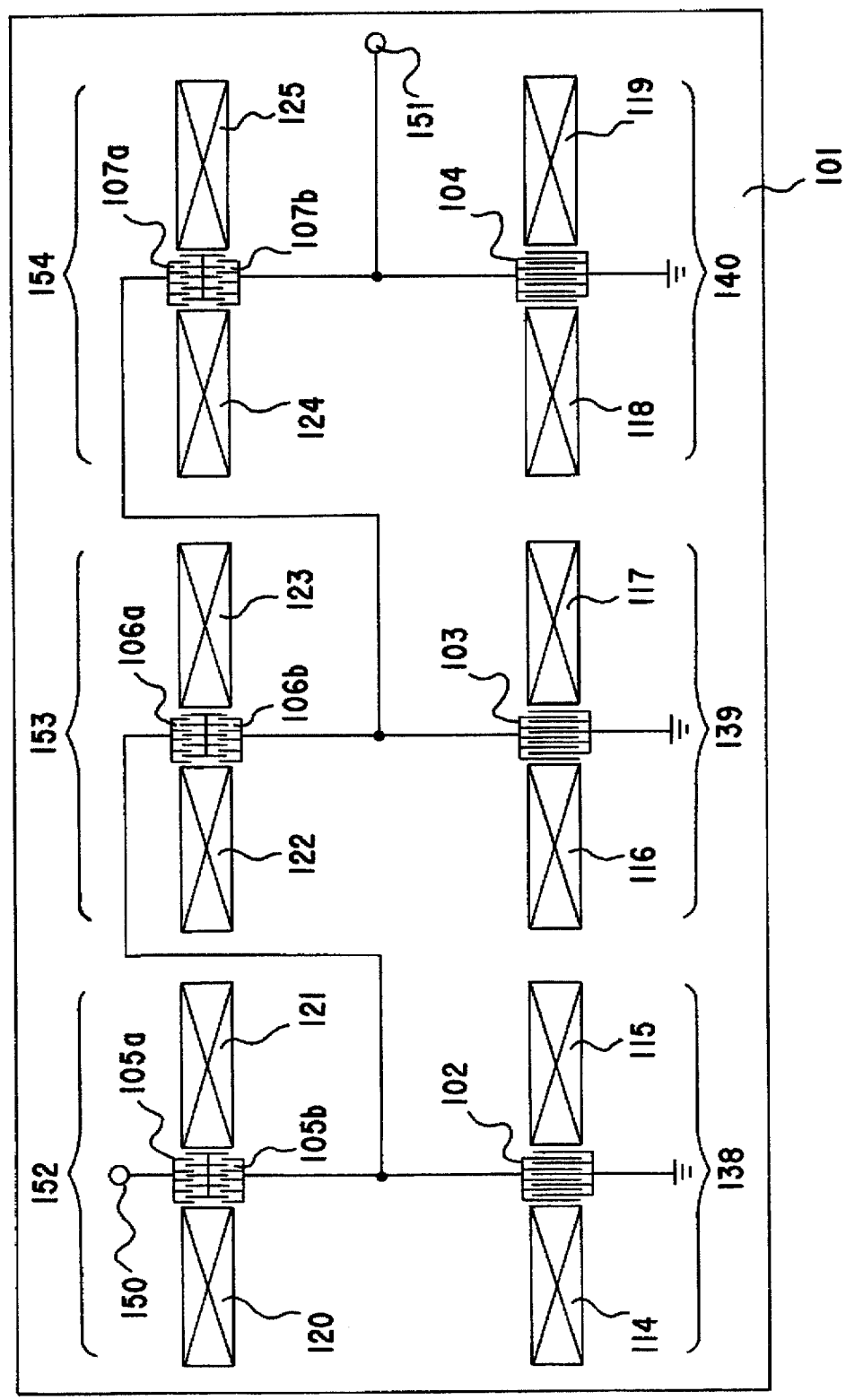
FIG. 8 is a schematic plan view showing a surface acoustic wave filter according to a fourth embodiment of the present invention.
Figure 9:
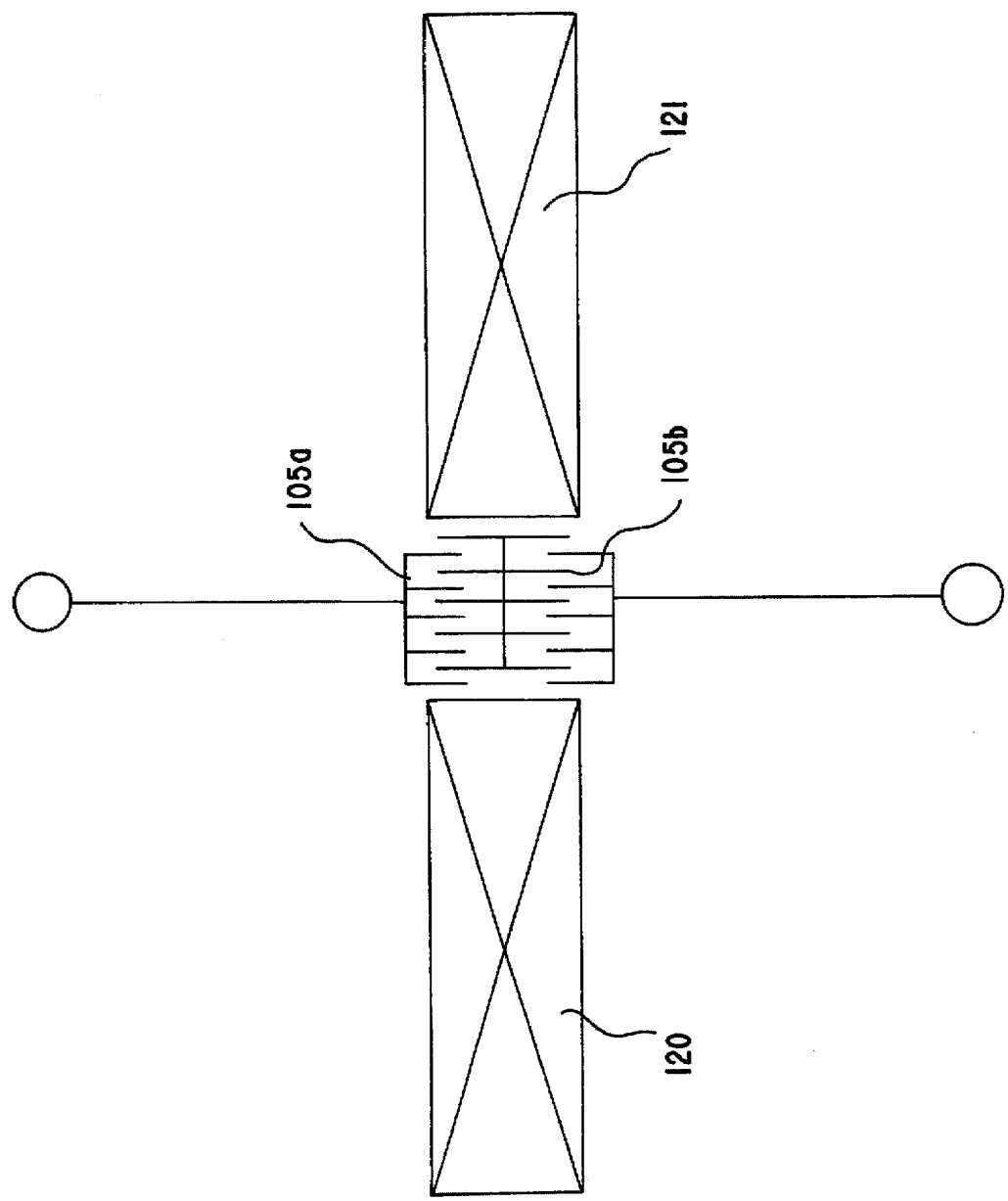
FIG. 9 is a schematic plan view showing in an enlarged manner one of surface acoustic wave resonators each connected in series with a signal line in the surface acoustic wave filter shown in FIG. 8.

Another embodiment of the present invention will be described on the basis of FIGS. 8 and 9. Each of the two interdigital transducers in the surface acoustic wave resonators each connected in series with the signal line shares the pair of strip type grating reflectors in the above described third embodiment, while respective two interdigital transducers 105a and 105b, 106a and 106b and 107a and 107b in surface acoustic wave resonators 152, 153 and 154 each connected in series with a signal line respectively share pairs of strip type grating reflectors 120 and 121, 122 and 123 and 124 and 125, as shown in FIG. 8, in the present embodiment. FIG. 9 is a schematic plan view showing in an enlarged manner one of the surface acoustic wave resonators each connected in series with the signal line.

The number of electrode fingers in the two interdigital transducers 105a and 105b, 106a and 106b or 107a and 107b is 100, and the cross width of the electrode fingers is set to 100 μm. In addition, the number of electrode fingers in each of the strip type grating reflectors 120, 121, 122, 123, 124 and 125 is 180.

Also in the surface acoustic wave high-frequency filter of the above described construction, the two interdigital transducers are connected in series, as in the embodiment 3. Consequently, the slope of the impedance characteristics becomes steep without moving a resonance point and an antiresonance point, thereby to make it possible to reduce the insertion loss and at the same time, ensure high attenuation outside the band. Further, the strip type grating reflectors are shared, whereby a space where the surface acoustic wave resonator is formed is decreased, thereby to make it possible to miniaturize the surface acoustic wave high-frequency filter.

(Embodiment 5)

Figure 10:
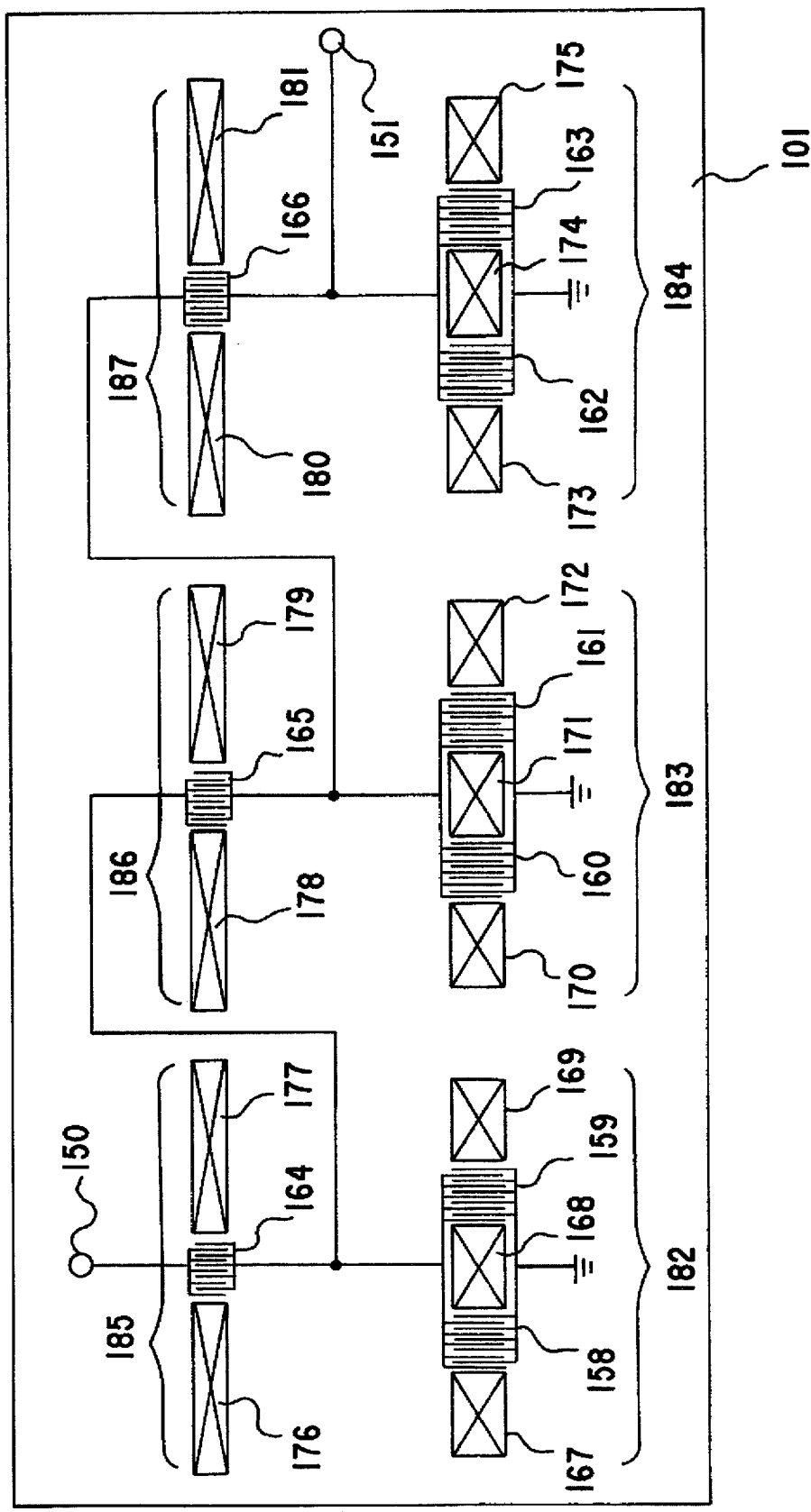
FIG. 10 is a schematic plan view showing a surface acoustic wave according to a fifth embodiment of the present invention.
Figure 11:
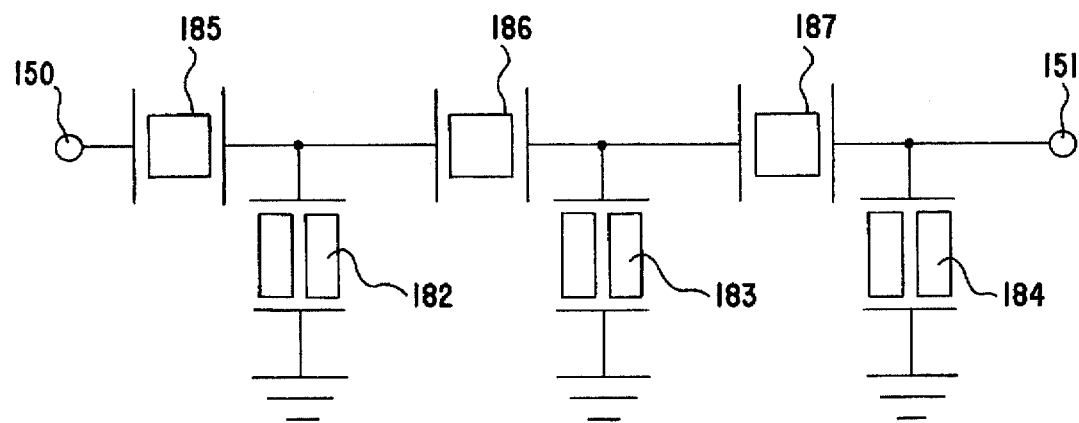
FIG. 11 is a diagram showing an equivalent circuit of the surface acoustic wave filter shown in FIG. 10.

A fifth embodiment of the present invention will be described on the basis of FIGS. 10 to 13. As shown in FIGS. 10 and 11, a surface acoustic wave high-frequency filter according to the present embodiment is constructed by connecting in series a first filter functional unit comprising surface acoustic wave resonators 182 and 185, a second filter functional unit comprising surface acoustic wave resonators 183 and 186, and a third filter functional unit comprising surface acoustic wave resonators 184 and 187.

Each of the surface acoustic wave resonators 185, 186 and 187 has input and output terminals, which are connected in series with a signal line. On the other hand, each of the surface acoustic wave resonators 182, 183 and 184 has input and output terminals, one of which is connected to the signal line and the other of which is grounded.

The surface acoustic wave resonators 185 to 187 each connected in series with the signal line comprise respective one interdigital transducers 164, 165 and 166 and pairs of strip type grating reflectors 176 and 177, 178 and 179 and 180 and 181 with the interdigital transducer interposed therebetween.

On the other hand, out of the surface acoustic wave resonators 182 to 184 each connected in parallel with the signal line, the surface acoustic wave resonator 182 comprises interdigital transducers 158 and 159 connected in parallel, the surface acoustic wave resonator 183 comprises interdigital transducers 160 and 161 connected in parallel, and the surface acoustic wave resonator 184 comprises interdigital transducers 162 and 163 connected in parallel.

Strip type grating reflectors 168, 167 and 169 are formed between the interdigital transducers 158 and 159 and beside the transducers, strip type grating reflectors 171, 170 and 172 are formed between the interdigital transducers 160 and 161 and beside the transducers, and strip type grating reflectors 174, 173 and 175 are formed between the interdigital transducers 162 and 163 and beside the transducers.

Figure 12:
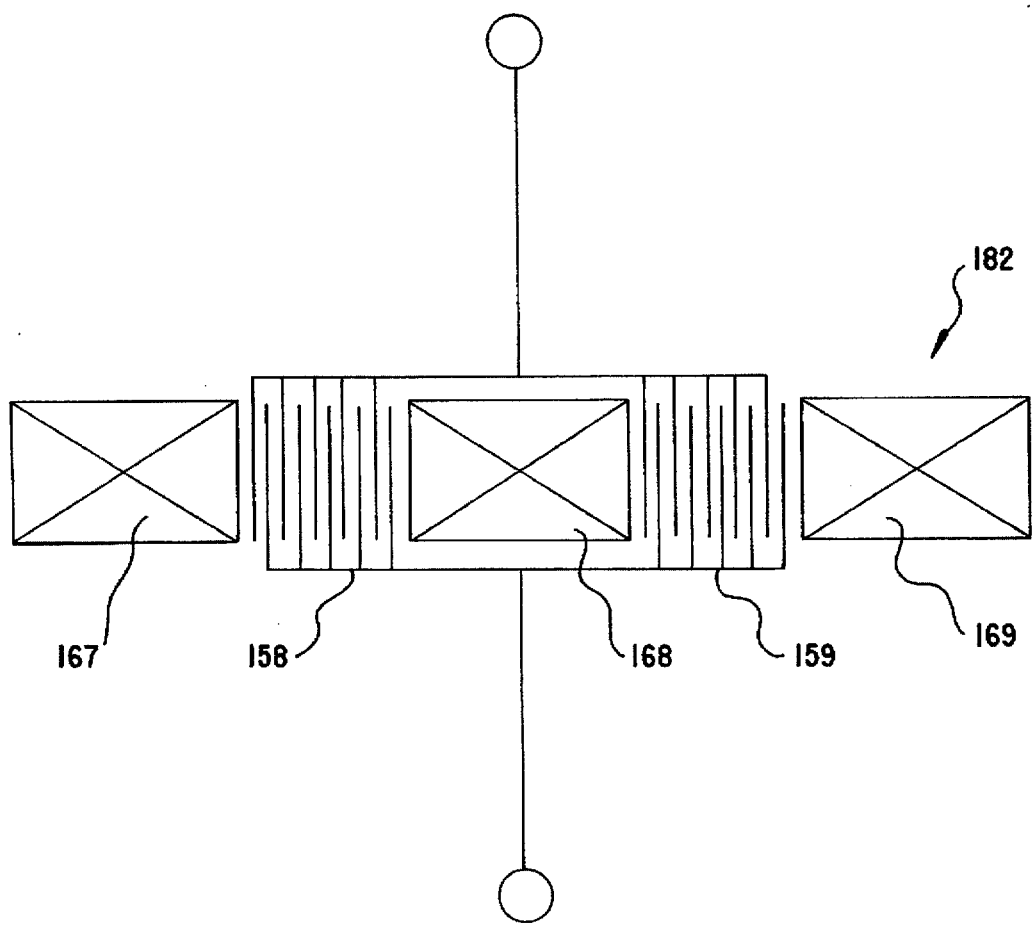
FIG. 12 is a schematic plan view showing in an enlarged manner one of surface acoustic wave resonators each connected in parallel with a signal line in the surface acoustic wave filter shown in FIG. 10.

Specifically, each of the surface acoustic wave resonators 182 to 184 each connected in parallel with the signal line is not constructed by merely connecting two surface acoustic wave resonators in parallel with each other. The surface acoustic wave resonator is provided with three strip type grating reflectors, although two surface acoustic wave resonators are inherently provided with four strip type grating reflectors, thereby to miniaturize the surface acoustic wave high-frequency filter. FIG. 12 illustrates in an enlarged manner one of the surface acoustic wave resonators each connected in parallel with the signal line.

The number of electrode fingers in each of the interdigital transducers 158 to 166 is 100. The cross width of the electrode fingers in each of the interdigital transducers 158 to 163 is 200 μm, and the cross width of the electrode fingers in each of the interdigital transducers 164 to 166 is 100 μm. In addition, the number of electrode fingers in each of the strip type grating reflectors 167 to 181 is 180.

In the above described construction, each of the surface acoustic wave resonators 182 to 184 each connected in parallel with the signal line is constructed by connecting two or more interdigital transducers in parallel. In addition, the cross width of the electrode fingers in each of the interdigital transducers 158 and 159 in the surface acoustic wave resonator 182 is two times that in the interdigital transducer 164 in the surface acoustic wave resonator 185. Accordingly, the impedance of each of the resonators 182 to 184 becomes not more than one-fourth that of the resonator comprising one interdigital transducer.

Even if the impedance characteristics of each of the surface acoustic wave resonators 185 to 187 each connected in series with the signal line are not changed, the slope thereof becomes steeper, as compared with that of the impedance characteristics of each of the surface acoustic wave resonators 182 to 184 each connected in parallel with the signal line.

Consequently, it is possible to reduce the insertion loss and at the same time, ensure high attenuation outside the band, as in, the embodiments 3 and 4.

Figure 13:
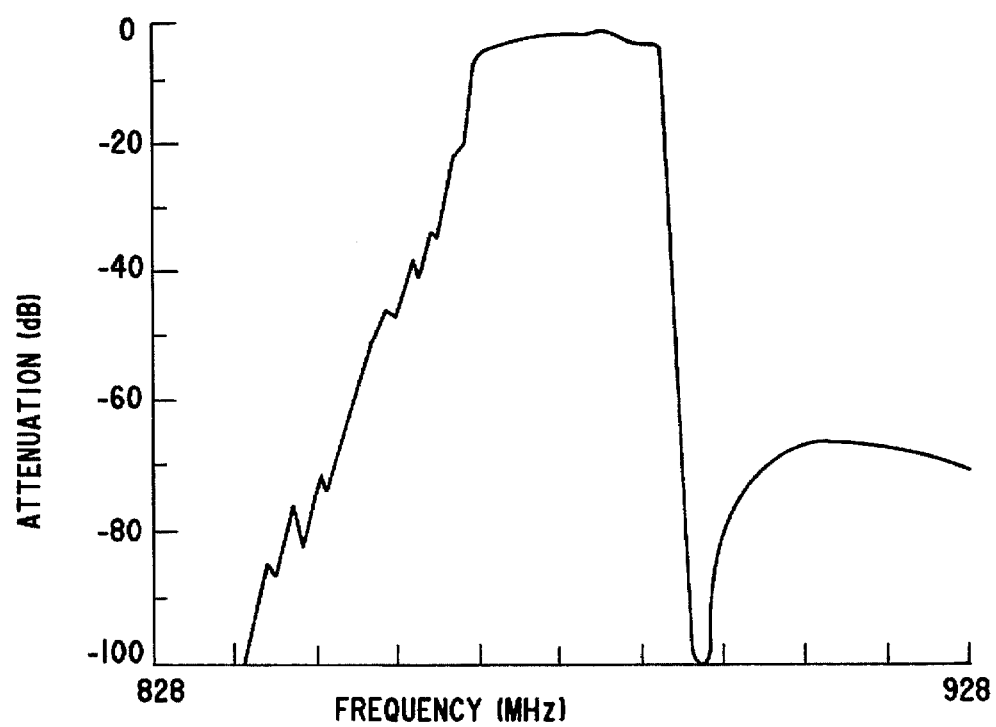
FIG. 13 is a diagram showing the frequency characteristics of the surface acoustic wave filter shown in FIG. 10.

FIG. 13 is a graph showing the frequency characteristics of the surface acoustic wave high-frequency filter of the above described construction. It is found that the out-of-band attenuation is increased by not less than 20 dB from comparison with the graph of FIG. 31 showing the frequency characteristics of the surface acoustic wave filter of the conventional construction shown in FIG. 29.

Although in the foregoing embodiments 3 to 5, the surface acoustic wave resonator comprises two interdigital transducers, it goes without saying that it comprises two or more interdigital transducers. In addition, the surface acoustic wave high-frequency filter may be so constructed that a first surface acoustic wave resonator comprises two or more interdigital transducers connected in series, and a second surface acoustic wave resonator comprises two or more interdigital transducers connected in parallel.

As described in the foregoing, according to the present invention shown in the embodiments 3 to 5, the impedance characteristics of each of the resonators each connected in series with the signal line can be made steeper while holding the frequency difference between the resonance point and the antiresonance point, as compared with the impedance characteristics of each of the resonators each connected in parallel with the signal line, thereby to make it possible to simultaneously satisfy low insertion loss and high out-of-band attenuation.

(Embodiment 6)

A sixth embodiment of the present invention will be described on the basis of FIGS. 15 to 17. A surface acoustic wave filter according to the present invention is an interdigitated interdigital transducer type surface acoustic wave filter. As shown in FIG. 15, two or more comb-shaped input electrodes 201a are formed in an input portion 201, and one or more comb-shaped output electrodes 202a are formed in an output portion 202. The comb-shaped input electrode 201a and the comb-shaped output electrodes 202a are alternately disposed on the same propagation path. In addition, bonding pads 207 are connected to the ground.

A pair of strip type comb-shaped reflectors 203 and 203' is provided on the outermost side of a group of the comb-shaped input and output electrodes 201a ... and 202a ... for the purpose of reducing the insertion loss.

Each of the comb-shaped reflectors 203 and 203' has conductor portions 203a and 203a (203a' and 203a') oppositely arranged which constitute the comb-shaped reflector 203 (203'), and reflector elements 203b ... (203b'. ..) extending from the conductor portions 203a and 203a (203a' and 203a') are so formed as not to be brought into contact with the opposite conductor portions 203a (203a').

In the interdigitated interdigital transducer type surface acoustic wave filter according to the present embodiment, only the comb-shaped reflector 203 on the left side in FIG. 15 is connected to the ground 208. Specifically, one of the conductor portions 203a and 203a opposite to each other in the comb-shaped reflector 203 is opened, while the other conductor portion 203a is connected to the ground 208.

On the other hand, the comb-shaped reflector 203' on the right side in FIG. 15 is opened. Specifically, both the conductors 203a' and 203a' opposite to each other in the comb-shaped reflector 203' are opened.

Although in the interdigitated interdigital transducer type surface acoustic wave filter shown in FIG. 15, only the comb-shaped reflector 203 on the left side in FIG. 15 is connected to the ground, only the comb-shaped reflector 203' on the right side in FIG. 15 may be connected to the ground, as shown in FIG. 16.

The characteristics of the interdigitated interdigital transducer type surface acoustic wave filter will be described.

FIG. 17 is a graph showing the pass characteristics of the interdigitated interdigital transducer type surface acoustic filter according to the above described embodiment. In addition, graphs are given in FIGS. 32 and 33 for the purpose of comparing characteristics. FIG. 32 shows the pass characteristics of the interdigitated interdigital transducer type surface acoustic wave filter of the conventional construction shown in FIG. 35, and FIG. 33 shows the pass characteristics of the interdigitated interdigital transducer type surface acoustic wave filter of the conventional construction shown in FIG. 35 in a case where both the comb-shaped reflectors are not connected to the ground. The above described filter is based on the specifications of a center frequency of 836 MHz and a bandwidth of 25 MHz.

As apparent from the drawings, the insertion losses of the interdigitated interdigital transducer type surface acoustic wave filter according to the present embodiment and the conventional filter are 2.9 dB, which are approximately the same.

As apparent from comparison between FIGS. 17 and FIG. 32, however, in the pass characteristics of the interdigitated interdigital transducer type surface acoustic wave filter according to the present embodiment, a ripple in the passband is reduced by approximately 0.3 dB, as compared with that in the conventional filter. Consequently, the ripple in the passband is not more than 0.7 dB, which satisfies characteristics required as a high-frequency filter.

On the other hand, in the case shown in FIG. 33, the ripple in the passband is approximately 0.7 dB, which is approximately the same as the ripple in the interdigitated interdigital transducer type surface acoustic wave filter according to the present embodiment. However, the interdigitated interdigital transducer type surface acoustic wave filter according to the present embodiment is superior for the reason that there exists distortion of waveform on the side of lower frequencies of the passband in the case shown in FIG. 33. It is considered that the distortion of waveform occurs from the instability in potential due to the fact that all the reflectors are not grounded.

FIG. 34 is a graph showing the relationship between the ratio of the number of reflector elements in the comb-shaped reflector 203 to the minimum number of electrode fingers in the comb-shaped input electrode 201a and the insertion loss. The ratio is calculated letting $M_i$ be the minimum number of electrode fingers in the comb-shaped input electrode 201a, $M_r$ be the number of reflector elements in the comb-shaped reflector 203 and letting $100 \cdot (M_r - M_i)/M_i$. As apparent from this graph, not less than –30% is required as the above described ratio so that the insertion loss is within –3.0 dB. In the interdigitated interdigital transducer type surface acoustic wave filter according to the present embodiment, the number of reflector elements in each of the comb-shaped reflectors 203 and 203' is set to not less than –30% of the minimum number of electrode fingers in the comb-shaped input electrode 201a, thereby to restrain the insertion loss.

In U.S. Pat. No. 5,175,711 (Hitachi, Ltd.), a surface acoustic wave filter in which an inductance element is connected to at least one of comb-shaped reflectors provided in both ends of an interdigital transducer has been known. The connection of the inductance element to the reflector physically differs in meaning from the construction of the reflectors in a short strip type.

(Embodiment 7)

A seventh embodiment of the present invention will be described on the basis of FIGS. 18 to 20. A surface acoustic wave filter according to the present embodiment corresponds to a combination of the construction of the embodiment 1 and the construction of the embodiment 6.

As shown in FIG. 18, a surface acoustic wave high-frequency filter is constructed by connecting in series a first filter functional unit comprising surface acoustic wave resonators 601 and 604, a second filter functional unit comprising surface acoustic wave resonators 602 and 605, and a third filter functional unit comprising surface acoustic wave resonators 603 and 606. The first to third filter functional units are formed on a piezoelectric substrate 621 composed of lithium tantalate.

Each of the surface acoustic wave resonators 604 to 606 is constituted by one interdigital transducer and a pair of strip type grating reflectors with the interdigital transducer interposed therebetween, as in the surface acoustic wave filter according to the embodiment 1 shown in FIG. 1, while each of the surface acoustic wave resonators 601 to 603 is constituted by strip type comb-shaped reflectors. In addition, each of the Surface acoustic wave resonators 601, 602 and 603 has input and output terminals, which are connected in series with a signal line 619 or 620, as in the embodiment 1 shown in FIG. 1. On the other hand, each of the surface acoustic wave resonators 604, 605 and 606 has input and output terminals, one of which is connected to the signal line 619 or 620 and the other of which is grounded.

Respective one comb-shaped reflectors 607, 609 and 611 out of comb-shaped reflectors 607 and 608, 609 and 610 and 611 and 612 in both ends of the surface acoustic wave resonators 601, 602 and 603 each connected in series with the signal lines are opened, while only the other comb-shaped reflectors 608, 610 and 612 are grounded.

FIG. 19 shows in an enlarged manner the surface acoustic wave resonator 601 which is one of the surface acoustic wave resonators each connected in series with the signal line. In addition, FIG. 20 shows the pass characteristics of the surface acoustic wave filter of the construction shown in FIG. 18. As can be seen from the pass characteristics, the ripple is slightly larger, as compared with that in the characteristics of the surface acoustic filter shown in FIG. 1 (see FIG. 2). However, the number of reflectors may be approximately one-half, as compared with that in the surface acoustic filter shown in FIG. 1, which is suitable for miniaturization.

Furthermore, the present embodiment corresponds to such construction that the electrically open strip type grating reflectors in the surface acoustic wave filter shown in FIG. 1 are replaced with comb-shaped reflectors. In the surface acoustic wave filter shown in FIG. 3, however, the pairs of electrically open strip type grating reflectors 34 and 35, 36 and 37 and 38 and 39 in the surface acoustic wave resonators 25, 26 and 27 each connected in parallel with the signal line may be replaced with pairs of comb-shaped reflectors to open one of the pair of comb-shaped reflectors and ground the other comb-shaped reflector. Also in this case, the number of reflectors may be approximately one-half.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave filter being constructed by connecting in series one or two or more filter functional units each comprising a first surface acoustic wave resonator having input and output terminals connected in series with a signal line and a second surface acoustic wave resonator having input and output terminals one of which is connected to said signal line and the other of which is grounded, and wherein said first surface acoustic wave resonator is constituted by one interdigital transducer and a pair of strip type comb-shaped reflectors with the interdigital transducer interposed therebetween, one of the strip type comb-shaped reflectors being connected to the ground and the other comb-shaped reflector being opened, and said second surface acoustic wave resonator is constituted by one interdigital transducer and a pair of electrically short strip type grating reflectors with the interdigital transducer interposed therebetween.

2. A surface acoustic wave filter being constructed by connecting in series one or two or more filter functional units each comprising a first surface acoustic wave resonator having input and output terminals connected in series with a signal line and a second surface acoustic wave resonator having input and output terminals one of which is connected to said signal line and the other of which is grounded, and wherein said first surface acoustic wave resonator is constituted by one interdigital transducer and a pair of electrically short strip type grating reflectors with the interdigital transducer interposed therebetween, and said second surface acoustic wave resonator is constituted by one interdigital transducer and a pair of strip type comb-shaped reflectors with the interdigital transducer interposed therebetween, one of the pair of strip type comb-shaped reflectors being connected to the ground and the other comb-shaped reflector being opened.

* * * * *